United States Patent
Zhu et al.

(10) Patent No.: US 10,734,165 B2
(45) Date of Patent: Aug. 4, 2020

(54) HETEROJUNCTION PEROVSKITE PHOTOVOLTAIC DEVICES AND METHODS OF MAKING THE SAME

(71) Applicant: Alliance for Sustainable Energy, LLC, Golden, CO (US)

(72) Inventors: Kai Zhu, Littleton, CO (US); Joseph Jonathan Berry, Boulder, CO (US); Marinus Franciscus Antonius Maria van Hest, Lakewood, CO (US); Joseph Matthew Luther, Boulder, CO (US); Adewole Philip Schulz, Massy (FR); Arrelaine Allen Dameron, Boulder, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 20 days.

(21) Appl. No.: 15/762,500

(22) PCT Filed: Oct. 3, 2016

(86) PCT No.: PCT/US2016/055154
§ 371 (c)(1),
(2) Date: Mar. 22, 2018

(87) PCT Pub. No.: WO2017/059420
PCT Pub. Date: Apr. 6, 2017

(65) Prior Publication Data
US 2018/0269005 A1    Sep. 20, 2018

Related U.S. Application Data

(60) Provisional application No. 62/236,661, filed on Oct. 2, 2015.

(51) Int. Cl.
*H01L 21/00* (2006.01)
*H01G 9/20* (2006.01)
(Continued)

(52) U.S. Cl.
CPC ......... *H01G 9/2018* (2013.01); *H01G 9/0036* (2013.01); *H01G 9/2009* (2013.01);
(Continued)

(58) Field of Classification Search
None
See application file for complete search history.

(56) References Cited

U.S. PATENT DOCUMENTS

2006/0185714 A1    8/2006  Nam et al.
2009/0266411 A1    10/2009 Habib et al.
(Continued)

FOREIGN PATENT DOCUMENTS

WO    WO 93/20569       10/1993
WO    2013/039019 A1    3/2013
(Continued)

OTHER PUBLICATIONS

Eperon, G. et al., "Morphological Control for High Performance, Solution-Processed Planar Heterojunction Perovskite Solar Cells," Advanced Functional Materials, Jan. 2014, 7 pages.
(Continued)

*Primary Examiner* — Calvin Y Choi
(74) *Attorney, Agent, or Firm* — Michael A. McIntyre

(57) ABSTRACT

An aspect of the present disclosures is a method that includes applying a perovskite precursor solution to a first solid conductor and treating the perovskite precursor solution such that a first portion of the perovskite precursor solution is converted to a first solid perovskite, where the first solid conductor comprises a first charge transport characteristic, which is predominantly p-type or predominantly n-type, and the treating results in the first solid perovskite having a second charge transport characteristic that is substantially the same as the first charge transport characteristic.

9 Claims, 14 Drawing Sheets

(51) Int. Cl.
H01L 51/44 (2006.01)
H01L 51/42 (2006.01)
H01G 9/00 (2006.01)
H01L 51/00 (2006.01)

(52) U.S. Cl.
CPC ...... *H01L 51/0007* (2013.01); *H01L 51/0028* (2013.01); *H01L 51/0077* (2013.01); *H01L 51/424* (2013.01); *H01L 51/4253* (2013.01); *H01L 51/441* (2013.01); *H01L 51/445* (2013.01); *H01L 51/0003* (2013.01); *Y02E 10/549* (2013.01); *Y02P 70/521* (2015.11)

(56) References Cited

U.S. PATENT DOCUMENTS

| | | |
|---|---|---|
| 2015/0200377 A1 | 7/2015 | Etgar et al. |
| 2015/0228415 A1 | 8/2015 | Seok et al. |
| 2016/0307704 A1 | 10/2016 | Hillhouse et al. |

FOREIGN PATENT DOCUMENTS

| | | |
|---|---|---|
| WO | WO 2015/001459 A1 | 1/2015 |
| WO | WO 2015/084961 A1 | 6/2015 |
| WO | WO 2015/092397 A1 | 6/2015 |

OTHER PUBLICATIONS

Labon, W. et al., "Depleted hole conductor-free lead halide iodide heterojunction solar cells," Energy & Environmental Science, vol. 6, 2013, pp. 3249-3253.

Miller, E. et al., "Substrate-controlled band positions in $CH_3NH_3PbI_3$ perovskite films," Phys. Chem. Chem. Phys., vol. 16, 2014, pp. 22122-22130.

Schulz, P. et al., "Electronic Level Alignment in Inverted Organometal Perovskite Solar Cells," Advanced Materials Interfaces, 2015, 5 pages.

Van Kerschaver, E. et al., "Back-contact Solar Cells: A Review," Progress in Photovoltaics: Research and Applications, vol. 14, 2006, pp. 107-123.

Verlinden, P.J. et al., "7000 High-efficiency Cells for a Dream," Progress in Photovoltaics: Research and Applications, vol. 2, 1994, pp. 143-152.

Search Report from corresponding PCT application No. PCT/US16/55154 dated Dec. 27, 2016, 3 pages.

Written Opinion from corresponding PCT application No. PCT/US16/55154 dated Dec. 27, 2016, 9 pages.

English translation of WO 2013/039019 A1, Toyota Motor East Japan, Inc., translated Apr. 29, 2019; 20 pages.

Yang et al., "High-performance photovoltaic perovskite layers fabricated through intramolecular exchange," Research Reports, vol. 348, Issue 6240, Jun. 2015, 5 pages.

Supplementary European Search Report from corresponding European patent application No. EP 16 85 2820, dated May 10, 2019, 8 pages.

HETEROJUNCTION PEROVSKITE PHOTOVOLTAIC DEVICES AND METHODS OF MAKING THE SAME

CROSS-REFERENCE TO RELATED APPLICATIONS

This application claims the benefit of U.S. Provisional Application No. 62/236,661 filed Oct. 2, 2015, the content of which is incorporated herein by reference in its entirety.

CONTRACTUAL ORIGIN

The United States Government has rights in this invention under Contract No. DE-AC36-08GO28308 between the United States Department of Energy and the Alliance for Sustainable Energy, LLC, the Manager and Operator of the National Renewable Energy Laboratory.

BACKGROUND

Research and development in the field of photovoltaics has focused on lowering production costs. One way of accomplishing this goal is to position both the negative contact and the positive contact on the rear surface of the photovoltaic device. Moving all connection circuitry to the rear surface allows for optimized module efficiency by increasing the packing density of the individual photovoltaic cells, reducing shading and resistive losses, while also changing the appearance of the outside surface to a uniform color.

Research and development in photovoltaics has also focused on advancing the performance of organo-metal halide absorber materials, in particular lead halide perovskites. Certified efficiencies as high as 20.1% have been reported for perovskites, thus placing pervoskites efficiencies in the same performance range as other state-of-the-art technologies.

However, better performing, more efficient, and longer lifetime photovoltaic device designs are still needed, as well as simpler, more cost-effective methods for making such devices. Thus, there remains a need for both better performing perovskite halide films, and photovoltaic devices made therefrom, but also improved manufacturing methods for making high performance perovskite halide films and photovoltaic devices.

SUMMARY

An aspect of the present disclosures is a method that includes applying a perovskite precursor solution to a first solid conductor and treating the perovskite precursor solution such that a first portion of the perovskite precursor solution is converted to a first solid perovskite, where the first solid conductor comprises a first charge transport characteristic, which is predominantly p-type or predominantly n-type, and the treating results in the first solid perovskite having a second charge transport characteristic that is substantially the same as the first charge transport characteristic. In some embodiments of the present disclosure, prior to the treating, the applying may further include applying the perovskite precursor solution to a second solid conductor that may include a third charge transport characteristic, which may be predominantly p-type or predominantly n-type, the second solid conductor may be separated by a space from the first solid conductor, the third charge transport characteristic may be opposite to the charge transport characteristic of the first charge transport characteristic, and the applying may at least partially fill the space with the perovskite precursor solution; during the treating, a second portion of the perovskite precursor solution may be applied to the second solid conductor, which may be converted to a second solid perovskite that includes a fourth charge transport characteristic that may be substantially the same as the third charge transport characteristic; and during the treating, a third portion of the perovskite precursor solution at least partially filling the space may be converted to a solid perovskite p-n junction.

In some embodiments of the present disclosure, the method may further include forming an additional solid on the first solid perovskite and the second solid perovskite, where the additional solid comprises at least one of a thermally insulating solid, an electrically insulating solid, a liquid barrier solid, or a gas barrier solid. In some embodiments of the present disclosure, the treating may include thermally treating the perovskite precursor solution. In some embodiments of the present disclosure, the thermally treating may include heating the perovskite precursor solution to a temperature between about 30° C. and about 120° C.

An aspect of the present disclosure is a method that includes depositing a first solid conductor onto a first portion of a first solid perovskite, where the first solid conductor includes a first charge transport characteristic, which is predominantly p-type or predominantly n-type, and the depositing results in at least a fraction of the first portion of the first solid perovskite converting to a second solid perovskite having a second charge transport characteristic that is substantially the same as the first charge transport characteristic. In some embodiments of the present disclosure, the method may further include depositing a second solid conductor onto a second portion of the first solid perovskite, where the second portion may be separated from the first portion by a third portion of the first solid perovskite, the third portion may not be in contact with either the first solid conductor or the second solid conductor, the second solid conductor may include a third charge transport characteristic, which is predominantly p-type or predominantly n-type, the third charge transport characteristic may be substantially opposite of the charge transport characteristic of the first charge transport characteristic, the depositing of the second solid conductor may result in at least a fraction of the second portion of the first solid perovskite converting to a third solid perovskite having a fourth charge transport characteristic that may be substantially the same as the third charge transport characteristic, and the third portion may be converted to a solid perovskite p-n junction.

In some embodiments of the present disclosure, the method may further include, prior to the depositing of the first solid conductor and the depositing of the second solid conductor, forming the first solid perovskite on a substrate. In some embodiments of the present disclosure, the forming may include applying a perovskite precursor solution to a surface of the substrate, and thermally treating the perovskite precursor solution to form the first solid perovskite. In some embodiments of the present disclosure, the method may further include, after the depositing of the first solid conductor and the depositing of the second solid conductor, removing the substrate from at least one of the first solid perovskite and the second solid perovskite. In some embodiments of the present disclosure, at least one of the depositing of the first solid conductor or the depositing of the second solid conductor may be performed by at least one of thermal evaporation, sputtering, pulsed laser deposition, electron beam deposition, and/or inkjet printing.

An aspect of the present disclosure is a device that includes a p-type solid conductor separated from an n-type solid conductor by a space, and a solid perovskite positioned in contact with the p-type solid conductor and the n-type solid conductor such that the solid perovskite includes a first portion that is in contact with the p-type solid conductor, a second portion that is in contact with the n-type solid conductor, and a third portion that at least partially fills the space, where the first portion includes a substantially p-type solid perovskite, the second portion includes a substantially n-type solid perovskite, and the third portion includes a solid perovskite p-n junction. In some embodiments of the present disclosure, the solid perovskite may include an alkyl ammonium metal halide. In some embodiments of the present disclosure, the alkyl ammonium metal halide may include at least one of $CH_3NH_3PbI_{3-x}Cl_x$ and/or $CH_3NH_3PbI_{3-x}Br_x$ where x is between 0 and 3. In some embodiments of the present disclosure, the p-type solid conductor may include a metal. In some embodiments of the present disclosure, the metal of the p-type solid conductor may include at least one of platinum, palladium, lead, copper, zinc, nickel, aluminum, indium, cobalt, tin, and/or gallium. In some embodiments of the present disclosure, the p-type solid conductor may include an oxide. In some embodiments of the present disclosure, the p-type solid conductor may include at least one of copper oxide ($Cu_2O$), nickel oxide (NiO), indium copper oxide ($InCuO_x$), and/or indium gallium oxide ($InGaO_x$). In some embodiments of the present disclosure, the p-type solid conductor may include at least one of spiro-OMeTAD, p-doped carbon nanotubes, p-doped graphene, and/or PEDOT:PSS.

BRIEF DESCRIPTION OF THE DRAWINGS

Some embodiments of the present disclosure are illustrated in referenced figures of the drawings. It is intended that the embodiments and figures disclosed herein are to be considered illustrative rather than limiting.

REFERENCE NUMBERS

Figure 1:
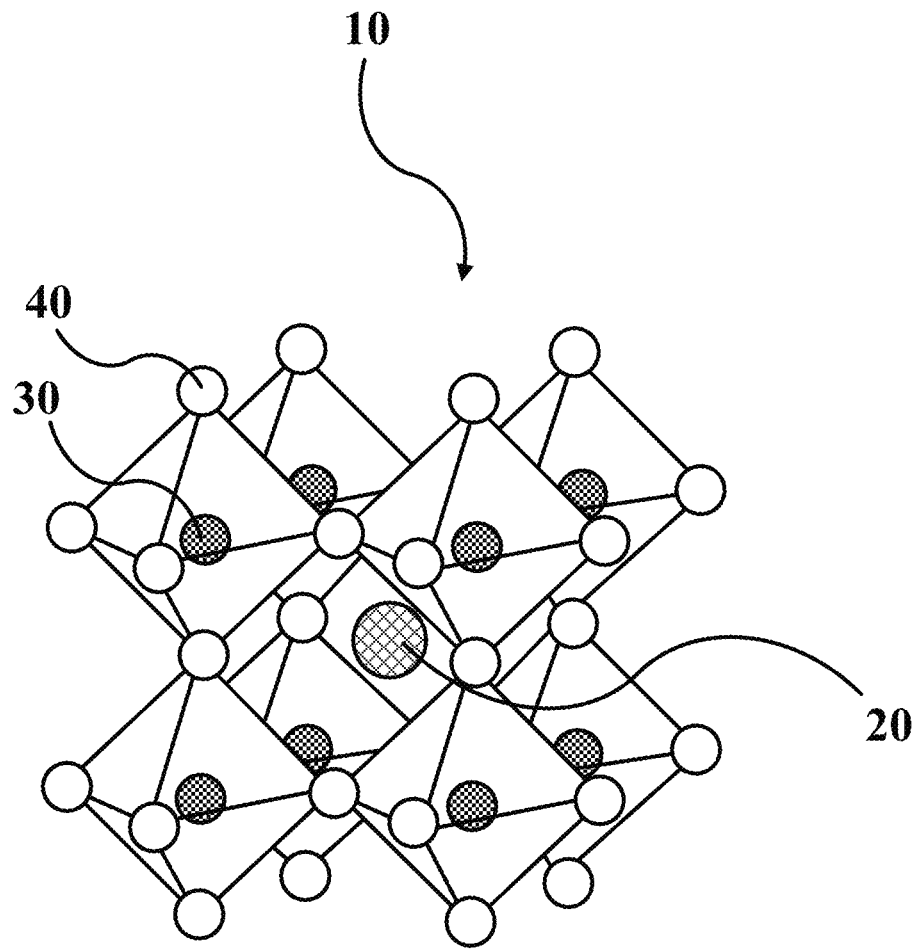
FIG. 1 illustrates an alkyl ammonium metal halide, according to some embodiments of the present disclosure.

10 . . . metal halide perovskite
20 . . . A-cation
30 . . . B-cation
40 . . . X-anion
100 . . . photovoltaic (PV) device
110 . . . light (e.g. sunlight)
115 . . . perovskite active layer
120 . . . p-type electrode
130 . . . n-type electrode
140 . . . p-type active region
150 . . . n-type active region
160 . . . p-n junction
170 . . . circuit
190 . . . p-type coating
192 . . . p-type core
195 . . . n-type coating
197 . . . n-type core
200 . . . substrate
210 . . . first busbar
230 . . . intrinsic region
300 . . . second busbar
310 . . . space
400 . . . first terminal
500 . . . second terminal
800 . . . a first manufacturing method
810 . . . substrate pre-treatment
820 . . . application of first electrode type
830 . . . application of second electrode type
840 . . . application of perovskite active layer
850 . . . perovskite active layer treatment
860 . . . substrate removal
900 . . . a second manufacturing method
910 . . . application of barrier layer
1300 . . . PV wire
1310 . . . metal core
1320 . . . metal oxide layer
1330 . . . perovskite active layer
1400 . . . PV fabric
1410 . . . p-type PV wire
1420 . . . n-type PV wire

DETAILED DESCRIPTION OF SOME EMBODIMENTS

This disclosure relates to designs of, and methods of making, perovskite-based photovoltaic devices (e.g. solar cells) that have interdigitated contacts and other useful structures. FIG. 1 illustrates that metal halide perovskites (10) may organize into cubic crystalline structures and may be described by the general formula $ABX_3$, where X (40) is an anion and A (20) and B (30) are cations, typically of different sizes (A typically larger than B). In a cubic unit cell, the B-cation (30) resides at the eight corners of a cube, while the A-cation (20) is located at the center of the cube and with 12 X-anions (40) centrally located between B-cations (30) along each edge of the unit cell. Typical inorganic perovskites include calcium titanium oxide (calcium titanate) minerals such as, for example, $CaTiO_3$ and $SrTiO_3$. In some structures, the A-cation (20) may include a nitrogen-containing organic compound such as an alkyl ammonium compound. The B-cation (30) may include a metal and the X-anion (40) may include a halogen.

Additional examples for the A-cation (20) include organic cations and/or inorganic cations. Organic A-cations (20) may be an alkyl ammonium cation, for example a $C_{1-20}$ alkyl ammonium cation, a $C_{1-6}$ alkyl ammonium cation, a $C_{2-6}$ alkyl ammonium cation, a $C_{1-5}$ alkyl ammonium cation, a $C_{1-4}$ alkyl ammonium cation, a $C_{1-3}$ alkyl ammonium cation, a $C_{1-2}$ alkyl ammonium cation, and/or a $C_1$ alkyl ammonium cation. Further examples of organic A-cations (20) include methylammonium ($CH_3NH^{3+}$), ethylammonium ($CH_3CH_2NH^{3+}$), propylammonium ($CH_3CH_2 CH_2NH^{3+}$), butylammonium ($CH_3CH_2 CH_2 CH_2NH^{3+}$), forma-midinium ($NH_2CH=NH^{2+}$), and/or any other suitable nitrogen-containing organic compound. In other examples, an A-cation (20) may include an alkylamine. Thus, an A-cation (20) may include an organic component with one or more amine groups. For example, an A-cation (20) may be an alkyl diamine halide such as formamidinium ($CH(NH_2)_2$).

Examples of metal B-cations 30 include, for example, lead, tin, germanium, and or any other 2+ valence state metal that may charge-balance the metal halide perovskite (10). Examples for the X-anion (40) include halogens: e.g fluorine, chlorine, bromine, iodine and/or astatine. In some cases, the perovskite halide may include more than one X-anion (40), for example alloys of different halogens; chlorine and iodine, bromine and iodine, and/or any other suitable pairs of halogens. In other cases, the metal halide perovskite 10 may include two or more halogens of fluorine, chlorine, bromine, iodine, and/or astatine.

Thus, the A-cation (20), B-cation (30), and X-anion (40) may be selected within the general formula of $ABX_3$ to produce a wide variety of metal halide perovskite (10), including, for example, methylammonium lead triiodide ($CH_3NH_3PbI_3$), and mixed halide perovskites such as $CH_3NH_3PbI_{3-x}Cl_x$ and $CH_3NH_3PbI_{3-x}Br_x$. So, a metal halide perovskite (10) may have more than one halogen element, where the various halogen elements are present in none integer quantities; e.g. where x varies from 0 to 3 in more than just integer values; e.g. 1, 2, or 3. In addition, perovskite halides, like other organic-inorganic perovskites, can form three-dimensional (3-D), two-dimensional (2-D), one-dimensional (1-D) or zero-dimensional (0-D) networks, possessing the same unit structure.

As stated above, the A-cation (20) may include an organic constituent in combination with a nitrogen constituent. In some cases, the organic constituent may be an alkyl group such as straight-chain or branched saturated hydrocarbon group having from 1 to 20 carbon atoms. In some embodiments, an alkyl group may have from 1 to 6 carbon atoms. Examples of alkyl groups include methyl ($C_1$), ethyl ($C_2$), n-propyl ($C_3$), isopropyl ($C_3$), n-butyl ($C_4$), tert-butyl ($C_4$), sec-butyl ($C_4$), iso-butyl ($C_4$), n-pentyl ($C_5$), 3-pentanyl ($C_5$), amyl ($C_5$), neopentyl ($C_5$), 3-methyl-2-butanyl ($C_5$), tertiary amyl ($C_5$), and n-hexyl ($C_6$). Additional examples of alkyl groups include n-heptyl ($C_7$), n-octyl ($C_8$) and the like.

Perovskite films or layers with compositions similar to those illustrated in FIG. 1, may be produced using various solution processing methods. For example, a "two-step" solution method for forming a perovskite film may be utilized, where the method includes applying a perovskite precursor solution onto a solid (e.g. solid electrode material), the solution containing at least two alkyl ammonium halides and a metal halide in a solvent. The method then may then include thermally treating the perovskite precursor solution, such that the treating removes substantially all of the solvent and at least a portion of at least one of the alkyl ammonium halides from the solution, and the remaining alkyl ammonium halides and the metal halide crystallize to form a final alkyl ammonium metal halide perovskite film on the solid. In some embodiments of the present invention, the perovskite precursor solution may include two alkyl ammonium halides. The first alkyl ammonium halide may be an alkyl ammonium chloride and the second alkyl ammonium halide may be an alkyl ammonium iodide. In some embodiments of the present invention, the alkyl group for the at least two alkyl ammonium halides used in a "two-step" solution processing method for making a solid perovskite active layer, may be at least one of a methyl group, an ethyl group, a propyl group, or a butyl group. Each of the at least two alkyl ammonium halides may have a halogen from at least one of fluorine, chlorine, bromine, iodine, and/or astatine, such that the halogen for each alkyl ammonium halide is different from the halogen of each of the remaining alkyl ammonium halides. A first alkyl ammonium halide may be alkyl ammonium chloride with a second alkyl ammonium halide with a halogen selected from bromine, iodine, or astatine. A metal of the metal halide may be at least one of lead, tin, germanium, or any other metal in the 2+ valence state. A solvent may be at least one polar solvent. For example, a solvent may be at least one of dimethysulfoxide, dimethylformamide, γ-butyrolactone, or N-methyl-2-pyrrolidone. The metal halide and the alkyl ammonium iodide may be present in the solution at a molar ratio of about one to one (1:1). The alkyl ammonium iodide and the alkyl ammonium chloride may be present in the solution at a molar ratio ranging from about 1:0.1 to about 1:4. At least one of the alkyl ammonium halides, or the metal halide may be present in the solution at a concentration ranging from about 0.1 M to about 3.0 M. Thermally treating a perovskite precursor solution to convert it to a solid perovskite may include heating the solution at a temperature that is between about 20° C. and about 250° C. The conversion of a perovskite precursor solution to a perovskite solid may include heating the solution for a period of time that is between about 30 seconds and about 6 hours.

Another example of a solution processing method for converting a perovskite precursor solution to a solid perovskite may be described as a "three-step" method, which may include applying a first perovskite precursor solution onto a solid (e.g. an electrode material), where the first solution may contain in a first solvent, a first alkyl ammonium halide with a first halogen, and a metal halide with a second halogen different from the first halogen. The method may further include completing a first thermal treatment of the first perovskite precursor solution to form a first solid film of the metal halide on the solid, followed by contacting a second perovskite precursor solution with the first film, the second perovskite precursor solution containing in a second solvent, a second alkyl ammonium halide with the second halogen, such that the second alkyl ammonium halide reacts with the first film to form a final crystalline alkyl ammonium metal halide perovskite film that is substantially free of the first film and the first halogen. Such a "three-step" method may further include, during at least a portion of the contacting, completing a second thermal treatment of the second solution and the first film. The first halogen and the second halogen may include fluorine, chlorine, bromine, iodine, and/or astatine. The first halogen may be chlorine and the second halogen may be iodine. The alkyl group for at least one of the first alkyl ammonium halide or the second alkyl ammonium halide may include at least one of a methyl group, an ethyl group, a propyl group, and/or a butyl group. The metal of the metal halide may include at least one of lead, tin, germanium, and/or any other metal in the 2+ valence state. The first solvent may include at least one polar solvent. The second solvent may include isopropyl alcohol. The metal halide and the first alkyl ammonium halide may be present in the first perovskite precursor solution at a molar ratio that is between about 1:0.1 and about 1:3. At least one of the metal halide and the first alkyl ammonium halide may be present in the first perovskite precursor solution at a concentration that is between about 0.1 M and about 3.0 M. The second alkyl ammonium halide may be present in the second perovskite precursor solution at a concentration that is between about 0.1 mg/ml solvent and about 100 mg/ml solvent. At least one of the thermal treatments may include heating at least one of the perovskite precursor solutions at a temperature that is between about 40° C. and about 250° C. At least one of the thermal treatments may include heating at least one of the perovskite precursor solutions for a period of time that is between about 30 seconds and about 6 hours.

Figure 2:
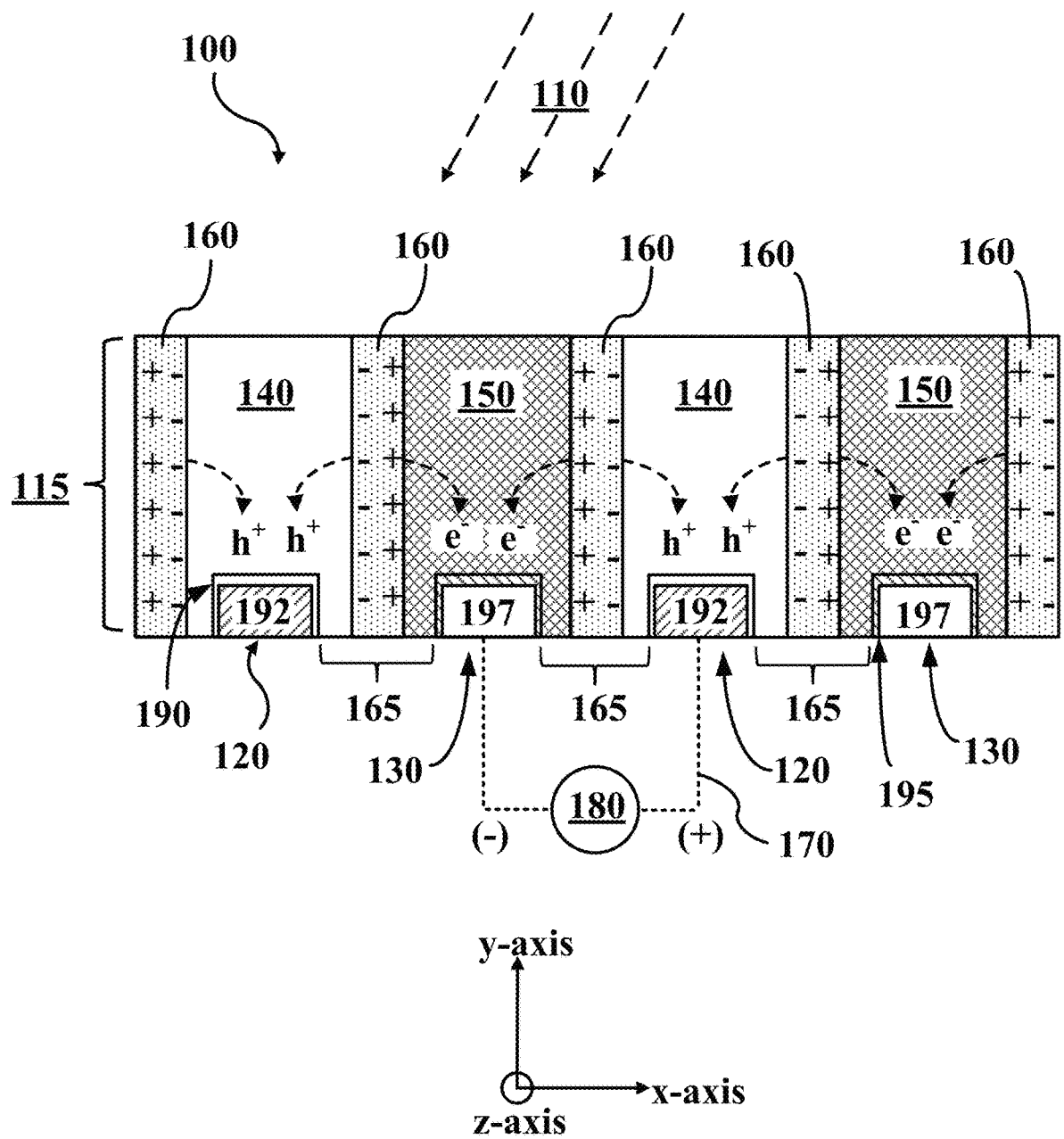
FIG. 2 illustrates a cross-sectional view of an interdigitated back contact (IBC) perovskite photovoltaic (PV) device, according to some embodiments of the present disclosure.

FIG. 2 illustrates a cross-sectional view of an example of an interdigitated back contact (IBC) perovskite photovoltaic device (PV), or PV device 100. This example of a PV device 100 has two p-type electrodes 120 and two n-type electrodes 130. This is for illustrative purposes only, and other examples of PV devices could have more or fewer of each type of electrode. The p-type electrodes 120 are referred to as "p-type" because they are constructed of materials that are better hole (h+) collectors than electron (e−) collectors, and the n-type electrodes 130 are referred to as "n-type" because they are constructed of materials that are better electron (e) collectors than hole (h+) collectors. A semiconductors preference to conduct electrons versus hole, whether it is p-type or n-type, can be detected using standard experimental procedures that measure the Hall Effect of the material of interest. Thus, in some embodiments of the present disclosure, a device having a first electrode characterized as a p-type material and a second electrode characterized as an n-type material may characterized as such because the first electrode is a better hole collector than the second electrode and, as a result, the second electrode is a better electron collector than the first electrode. In other words, a device having a first electrode characterized as a p-type material and a second electrode characterized as an n-type material may be characterized as such because the first electrode predominantly conducts holes (e.g. conducts more holes than electrons) while the second electrode predominantly conducts electrons (e.g. conducts more electrons than holes). By way of examples, a first electrode (e.g. a solid conductor) having a first charge transport characteristic "opposite" to a second charge characteristic of a second electrode means that if the second charge characteristic is predominantly p-type, the second charge characteristic is predominantly n-type or if the second charge characteristic is predominantly n-type, the first charge characteristic is predominantly p-type.

Examples of suitable hole collecting or p-type electrode materials include platinum, palladium, $Cu_2O$, NiO, Spiro-OMeTAD (2,2',7,7'-tetrakis-(N,N-di-p-methoxyphenyl-amine)-9,9'-spirobifluorene), p-doped carbon nanotubes, p-doped graphene, and/or PEDOT:PSS (poly(3,4-ethylene-dioxythiophene) polystyrene sulfonate). Examples of suitable electron collecting or n-type electrode materials include FTO (fluorine doped tin oxide), $Al_2O_3$, ZnO, $TiO_2$, $ZrO_2$, SnO, InSnO, n-doped carbon nanotubes, and/or n-doped graphene.

In some cases, electrodes may be provided in the form of an internal core, where one or more layers and/or coatings cover the internal core. Referring again to FIG. 2, a p-type electrode 120 may be constructed from a p-type core 192, where at least one of the outside surfaces of the p-type core 192 is covered and/or coated by a p-type coating 190. For example, a p-type core 192 may be constructed of a metal such as at least one of copper, nickel, and/or any other suitable metal and/or metal alloy. The p-type core 192 may have at least a portion of its outside surfaces covered and/or coated with a p-type coating 190 such as $Cu_2O$, NiO, and/or any other suitable metal oxide and/or oxide of a metal alloy. An n-type electrode 130 may be constructed from an n-type core 197, where at least one of the outside surfaces of the n-type core 197 is covered and/or coated by an n-type coating 195. For example, an n-type core 197 may be constructed of a metal such as at least one of indium, tin, aluminum, zinc, titanium, zirconium, and/or any other suitable metal or metal alloy. The n-type core 197 may have at least a portion of its outside surfaces covered and/or coated with an n-type coating 195 of $SnO_2$, $Al_2O_3$, ZnO, $TiO_2$, $ZrO_2$, InSnO, and/or any other suitable metal oxide and/or oxide of a metal alloy. In some cases, at least one of a p-type and/or n-type electrode may be constructed of a metal and/or metal alloy, which has been oxidized to produce a metal core with an outside layer of metal oxide and/or metal alloy oxide. For example, an electrode may have a central core made from at least one metal of copper, nickel, tin, aluminum, zinc, titanium, indium, and/or zirconium. The central core may then be oxidized to produce an electrode with a center core of the at least one metal and an outside layer having at least one metal oxide and/or metal alloy oxide. A core may be constructed of a conductive material, such as a metal, carbon nanotubes, graphene, and the like. In some embodiments of the present disclosure, the combination of a metal used in conjunction with the processing of the metal halide perovskite may be manipulated to produce a metal/halide interface, which may serve as a hole-transfer material (HTM) and/or an electron transfer material (ETM): e.g. $CuI_x$ may form on a copper solid during the formation of a perovskite solid (layer or film) on the copper solid, where the $CuI_x$ may function in the final device as a HTM.

FIG. 2 illustrates that a PV device may have n-type electrodes 130 and p-type electrodes 120 in alternating positions along the x-axis direction; e.g. p-type electrode 120, n-type electrode 130, p-type electrode 120, n-type electrode, etc. The alternating electrodes may be separated from their neighboring electrodes by gaps 165 (e.g. to prevent shorting the circuit). In FIG. 2, the gaps 165 are at least partially occupied by p-n junctions.

The PV device 100 of FIG. 2 includes a perovskite active layer 115, positioned to be in physical contact with, and placed on (in the y-axis direction) the p-type electrodes 120 and the n-type electrodes 130. The perovskite active layer 115 includes at least one p-type active region 140 and at least one n-type active region 150. Each p-type active region 140 is positioned adjacent to a p-type electrode 120, and each n-type active region 150 is positioned adjacent to an n-type electrode 130. Thus, the perovskite active layer 115 is configured so that each p-type active region 140 may generate holes ($h^+$) that may be collected at a corresponding p-type electrode 120, and the perovskite active layer 115 is also configured so that each n-type active region 150 may generate electrons (e) that may be collected at a corresponding n-type electrode 130.

The example in FIG. 2 shows the n-type active regions 140 and the p-type active regions 150 placed in alternating positions along the x-axis direction; e.g. p-type active region 140, n-type active region 150, p-type active region 140, n-type active region 150, etc. Each n-type active region 140 is separated from its neighboring p-type active region 150 neighbors by p-n junctions 160 and each p-type active region 150 is separated from its neighboring n-type active regions 150 by p-n junctions 160. Each p-n junction 160 has an area of positive charge (+) adjacent to an n-type active region 150 and an area of negative charge (−) adjacent to a p-type active region 140. Thus, the perovskite active layer 115 is divided along the x-axis direction (laterally) into alternating columns of p-type active regions 140 and n-type active regions 150, with each active region separated from its neighboring active regions by p-n junctions 160. This lateral configuration of alternating p-type active regions 140, each in contact with its corresponding p-type electrode 120, and n-type regions 150, each in contact with its corresponding n-type electrode 130, with intervening p-n junctions 160 in between, enables the PV device 100 to generate an open-circuit voltage when exposed to light 110. Completing a circuit 170 between electrodes of opposite polarity (n-type electrode (−) and p-type electrode (+)) enables the PV device 100 to generate a current in response to light 110 striking its top surface, and the resultant current may drive a load 180 to do work.

As mentioned above, each p-type active region 140 is associated with a corresponding p-type electrode 120, and each n-type active region 150 is associated with a corresponding n-type electrode 130. A p-type active region 140 of a perovskite active layer 115 may be positioned to substantially surround the outside surfaces of a p-type electrode 120. In the example shown in FIG. 2, the p-type active region 140 extends upward in the y-axis direction to form a p-type active region 140 with an essentially columnar shape. Similarly, each n-type active region 150 is positioned to substantially surround the outside surfaces of an n-type electrode 130, where the n-type active region 150 extends upward in the y-axis direction to form an n-type active region 150 with an essentially columnar shape. Thus, in this example, each column-shaped (in the x-y plane) active region is separated from its neighbors by a p-n junction 160, which is also column-shaped.

In addition, the device shown in FIG. 2 may also have intrinsic regions (not shown), for example on top of the perovskite active layer 115. Intrinsic regions are regions that have not been induced by the underlying electrodes to form into p-type regions and/or n-type regions.

Figure 3:
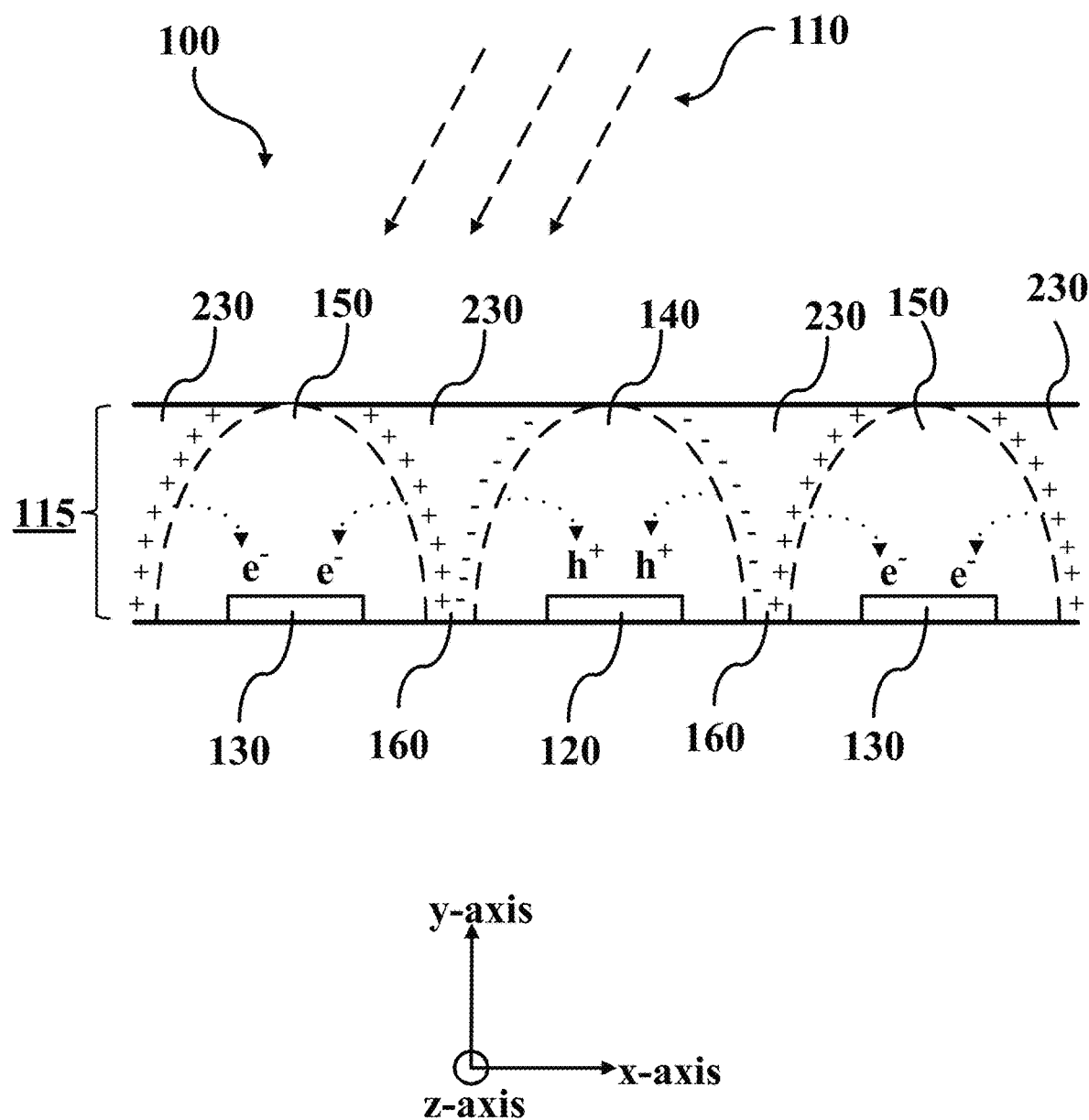
FIG. 3 illustrates a cross-sectional view of an interdigitated back contact (IBC) perovskite photovoltaic (PV) device, according to some embodiments of the present disclosure.

However, this column-like configuration of alternating p-type active regions 140 and n-type active regions 150, separated by column-like p-n junctions 160 is not required and other configurations fall within the scope of this disclosure. FIG. 3 illustrates another cross-sectional view, in the x-y plane, of an example of an interdigitated back contact (IBC) perovskite photovoltaic device (PV), or PV device 100. In this example, as in FIG. 2, alternating n-type electrodes 130 and p-type electrodes 120, are separated from each other by spaces (e.g. to prevent shorting the circuit). Each electrode is in contact with a corresponding active area: a p-type active area 150 with a p-type electrode 120, and an n-type active area 150 with an n-type electrode 130. As in FIG. 2, each active area of the perovskite active layer 115 is separated from its neighboring active layers by p-n junctions 160.

However, in the example of FIG. 3, the active regions are in the shape of half-circles and/or half-ellipses (in the x-y plane) positioned around their corresponding electrodes. The widest part of the half-circles are positioned within the perovskite active layer 115 in substantially the same plane (in the x-z plane) as the electrodes, and the apex of the half-circles are positioned closest to the top, light-receiving surface of the perovskite active layer 115. Thus, the neighboring half-circle-shaped active regions, frame intervening p-n junctions 160, described by a small width in the x-axis direction closest to the electrodes, with increasing width in the y-axis direction towards the light-receiving surface.

Thus, the shape of the active areas (140 and 150) and the p-n junctions 160, and their relationship to one another in 3-dimensional space, may vary from a relatively simple geometric configuration illustrated in FIG. 2 to something more complicated as shown in FIG. 3. This proposed device configuration is enabling for improving the light management (e.g. anti-reflection coating) or improved stability (e.g. barrier layer to prevent degradation of active layer). This could be done using the contacts as multifunctional device components in this alternative device configuration.

FIG. 3 also illustrates the possibility of a device 100 retaining intrinsic regions 230, regions that are not induced by the underlying electrodes to form into p-type regions and/or n-type regions. Instead, intrinsic regions 230 may maintain the "intrinsic" characteristics of the starting material used to make the perovskite active layer 115.

Figure 4:
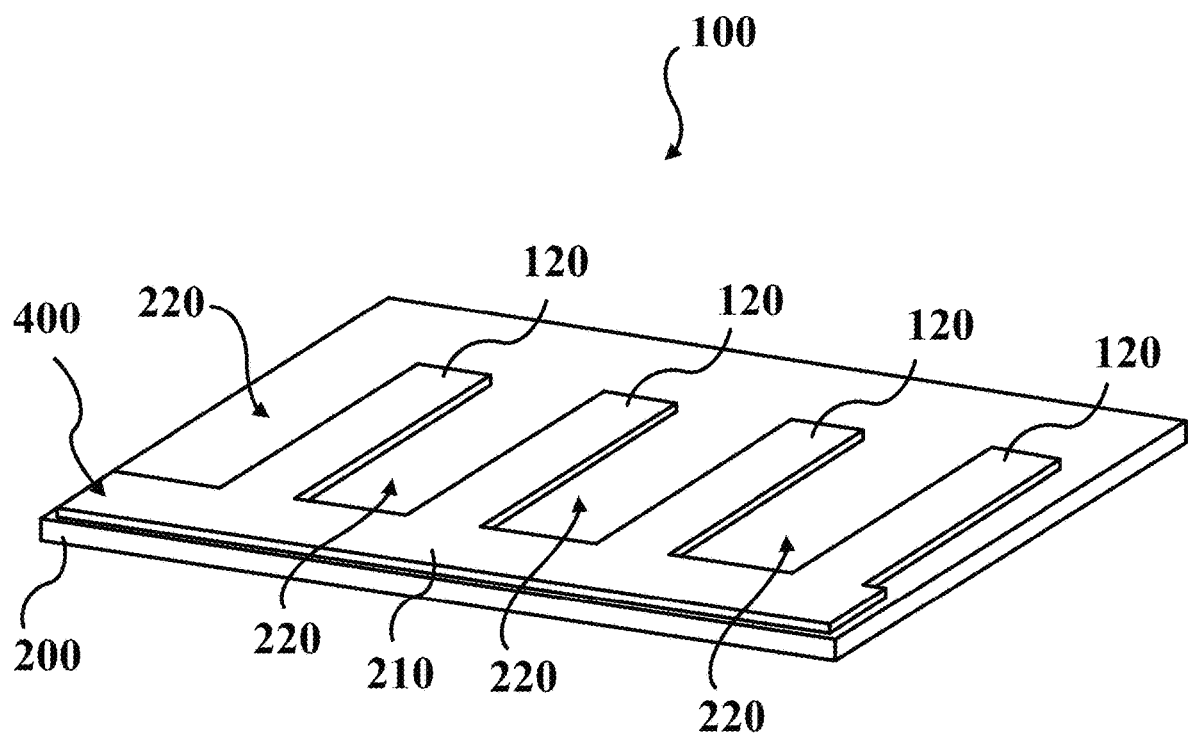
FIG. 4 illustrates a perspective view of the application of a p-type electrode to the top surface of a substrate, according to some embodiments of the present disclosure (e.g. by a first method).
Figure 4:
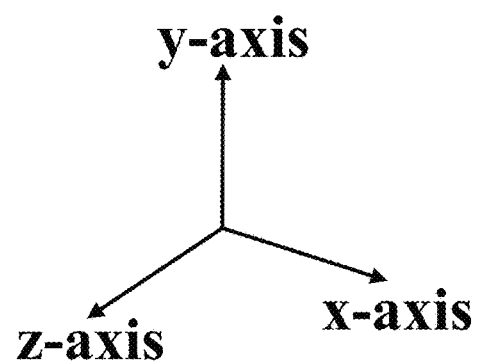

FIGS. 4 through 7 illustrate in more detail each of the various features and elements previously described in FIGS. 2 and 3, when constructing a PV device using a first manufacturing method, referred to hereafter as the "first method". Referring to FIG. 4, an interdigitated back contact (IBC) perovskite photovoltaic device (PV), or PV device 100, may be constructed by depositing a first electrode onto a substrate 200. In this example, four p-type electrodes 120 are positioned on a substrate, and configured to be substantially parallel to each other and aligned with the z reference axis, each with a first end extending outwardly in the z-axis direction. Each of the electrodes are positioned parallel to one another, with a gap 220 in between. The remaining end of each electrode terminates at a shared busbar, referred to herein as the "first" busbar 210. In this example, the first busbar 210 is positioned substantially perpendicular to the p-type electrodes 120, to form a complete first terminal 400. Thus, the first terminal 400 may be in the form of a long rectangular tab (the first busbar 210) aligned along the x-axis, with one or more shorter rectangular tabs (p-type electrodes 120) extending perpendicularly from the long rectangular tab, such that all of the tabs are substantially positioned within the same plane (the x-z plane). These figures show the electrodes in a substantially parallel alignment, however, this is not required, not do they need to be of an equal width, thickness, and/or height. For example, the electrodes may be tapered in width, height, and/or length. The same variations in height, width, and/or length apply to the busbars.

The first terminal 400 shown in FIG. 4, which includes the p-type electrodes 120 and the first busbar 210, may be deposited onto the substrate 200 by various methods: e.g. plating, chemical solution deposition, spin coating, chemical vapor deposition, atomic layer deposition, thermal evaporation, sputtering, and/or laser deposition. Electrode configuration could be implemented using conventional additive and subtractive photolithographic processing or using direct write-techniques (e.g. ink-jet, blade, spray) or any combination of these approaches. After the material(s) for the first terminal 400 have been deposited onto the substrate 200, various methods may be used to pattern the materials to obtain the final shape of the first terminal 400: e.g. silk screen printing, photo engraving, laser resist ablation, etc. Electrode configuration may be implemented using conventional additive and subtractive photolithographic processing or using direct write-techniques (e.g. ink-jet, blade, spray) or any combination of these approaches.

In this example, the p-type electrodes 120 are deposited and patterned on the substrate 200 in a first, independent step. However, it should be understood that n-type electrodes could alternatively be deposited and patterned on the substrate 200 in a first, independent step. In still other examples, one or more electrode materials (e.g. both p-type and n-type) may be deposited simultaneously onto the substrate 200. More details on various manufacturing methods are provided later in this disclosure (see FIGS. 10 and 11).

Figure 5:
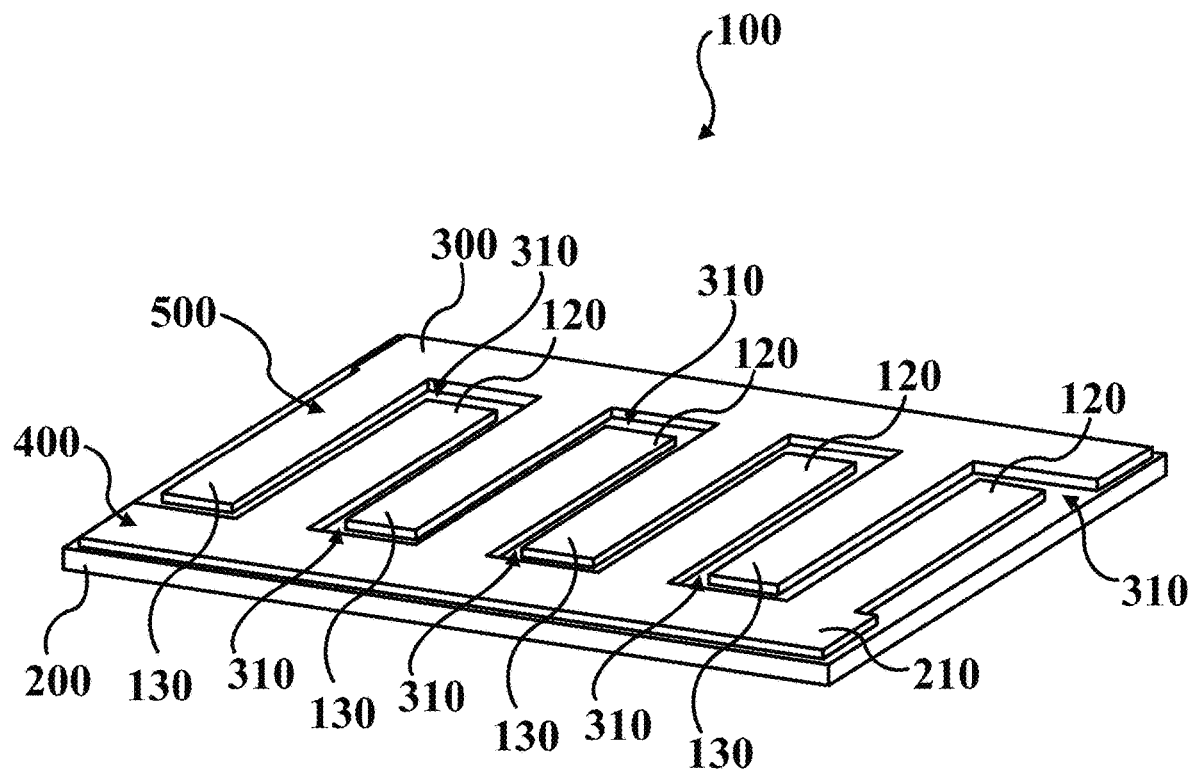
FIG. 5 illustrates a perspective view of the application of an n-type electrode to the top surface of a substrate to create interdigitated back contacts, according to some embodiments of the present disclosure (e.g. by a first method).
Figure 5:
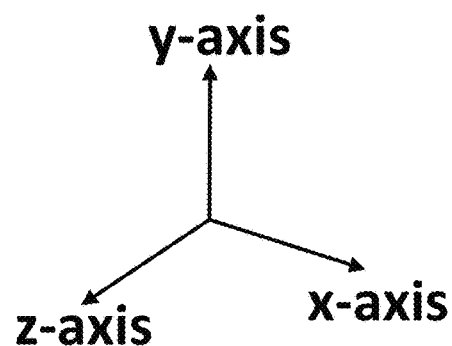

FIG. 5 illustrates a PV device 100 resulting from a next step of the "first method", the deposition of a second terminal 500 onto the substrate 200. In this example, the second terminal 500 includes four n-type electrodes 130, which are positioned within the gaps 220 that were previously formed by the p-type electrodes 120. The positioning of the n-type electrodes 130 into the gaps 220 between the p-type electrodes, results in the alternating electrode configuration (in the x-axis direction) shown in FIGS. 2 and 3. One end of each n-type electrode 130 extends in the z-axis direction towards the first busbar 210, but a space 310 remains so that the p-type electrodes 120 do not physically touch the first busbar 210 or the n-type electrodes 130. The remaining end of each n-type electrode 130 terminates at a second busbar 300, which is positioned substantially perpendicular to the n-type electrodes 130 and parallel to the first busbar 210. Thus, the second terminal 500 may be in the form of a long rectangular tab (the second busbar) aligned along the x-axis, with one or more shorter rectangular tabs (n-type electrodes 130) extending perpendicular from the long rectangular tab, such that all of the tabs are substantially positioned within the same plane (the x-z plane).

Thus, in the example shown in FIG. 5, both the p-type electrodes 120 and the n-type electrodes 130 are positioned substantially parallel to one another, within the same plane (in the x-z plane), and aligned along the z-axis direction. A space 310 remains between neighboring electrodes to prevent shorting. This space runs continuously across the PV device 100, alternating between straight runs in the x-axis direction and straight runs in the z-axis direction, resulting in an unbroken, continuous space separating the first terminal 400 from the second terminal 500. Grid spacing can vary between overlapping to over 1 mm separation.

The first terminal 500 shown in FIG. 5, which includes the p-type electrodes 120 and the first busbar 300, may be deposited onto the substrate 200 by various methods solution or vapor phase deposition technique: e.g. plating, chemical solution deposition, spin coating, chemical vapor deposition, atomic layer deposition, thermal evaporation, sputtering, and/or laser deposition. After the material(s) for the first terminal 500 have been deposited onto the substrate 200, various methods may be used to pattern the materials to obtain the final shape of the first terminal 500: e.g. silk screen printing, photo engraving, laser resist ablation, other conventional additive and subtractive photolithographic processing or using direct write-techniques (e.g. ink-jet, blade, spray) or any combination of these approaches etc. Alternatively, a PV device 100 similar to that shown in FIG. 5 can also be obtained by simultaneously depositing and patterning both terminals or components thereof onto the substrate 200.

Figure 6:
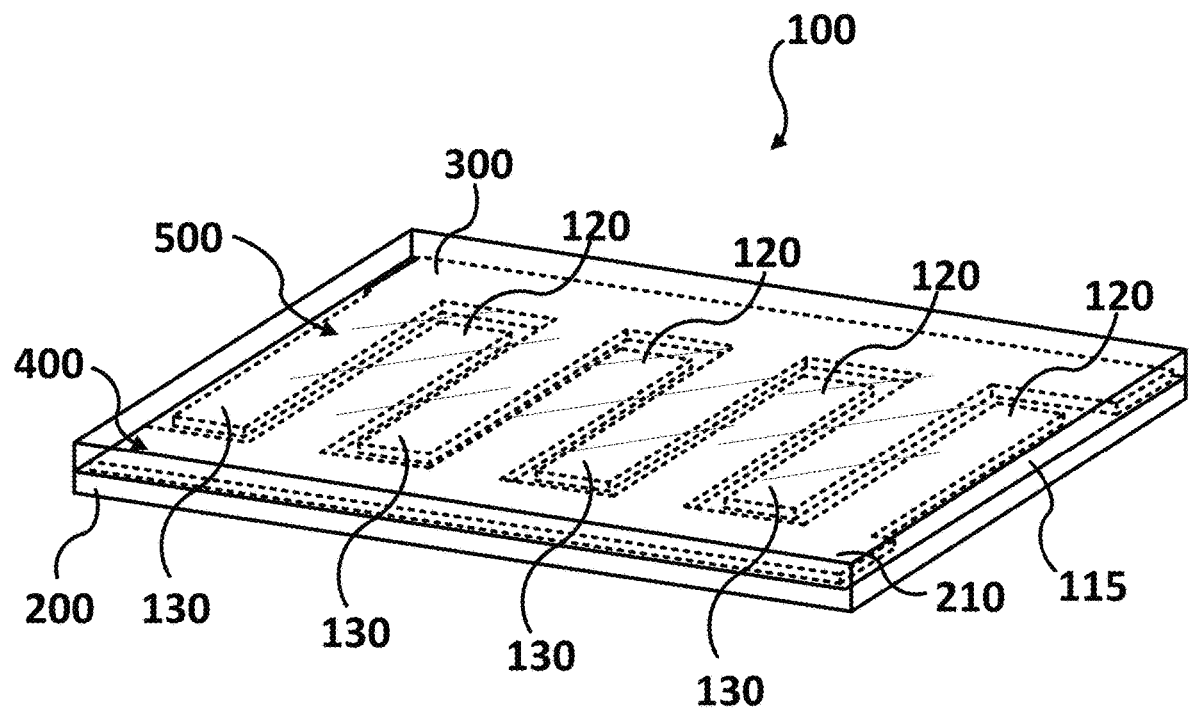
FIG. 6 illustrates a perspective view of the application of a perovskite active layer to the top surfaces of the n-type, p-type electrode, and substrate to create an interdigitated back contact perovskite PV device, according to some embodiments of the present disclosure (e.g. by a first method).
Figure 6:
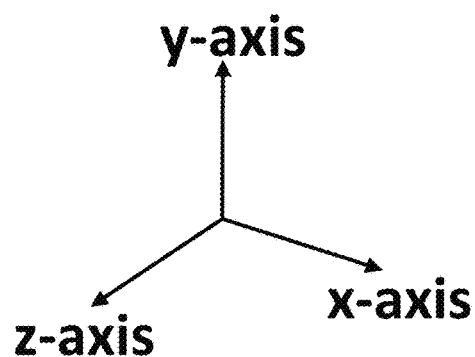

FIG. 6 illustrates an example of a structure of a PV device 100 after completion of the next step of the "first method", deposition of a perovskite active layer 115. Deposition of the perovskite active layer 115 covers the first terminal 400, the second terminal 500, and any remaining, exposed substrate 200 with perovskite material. The result is a PV device 100, which includes a bottom substrate 200, a top perovskite active layer 115, with a first terminal 400 and second terminal 500 sandwiched between. As shown in the subsequent examples below, deposition of the perovskite active layer 115 onto a series of alternating p-type electrodes 120 and n-type electrodes 130 results in, or induces, the formation of corresponding p-type active regions 140 and n-type active regions 150, separated by p-n junctions 160. The perovskite active layer 115 may be deposited onto the device 100 by solution processing methods and/or CVD methods.

As describe above, the first terminal 400, the second terminal 500, the perovskite active layer 115, and any other desired layers (e.g. antireflective coating) may be placed onto a substrate 200 during the manufacturing process, for example to facilitate easier manufacturing. However, the substrate 200 may or may not remain a permanent part of the PV device 100. If the substrate 200 is to remain a part of the completed PV device 100, then the substrate 200 may be made from an electrically insulating material to prevent shorting between the two terminals. Examples of electrically insulating materials include glass, glass epoxy, and/or various plastics such as polyethylene terephthalate, ABS (acrylonitrile, butadiene, and styrene), and/or PTFE (polytetrafluoroethylene) or any other materials used as insulating substrates for electronic devices. FIG. 6 illustrates a final form of a PV device 100 that retains the substrate 200, where the device is made by the "first method" (see FIG. 10).

Figure 7:
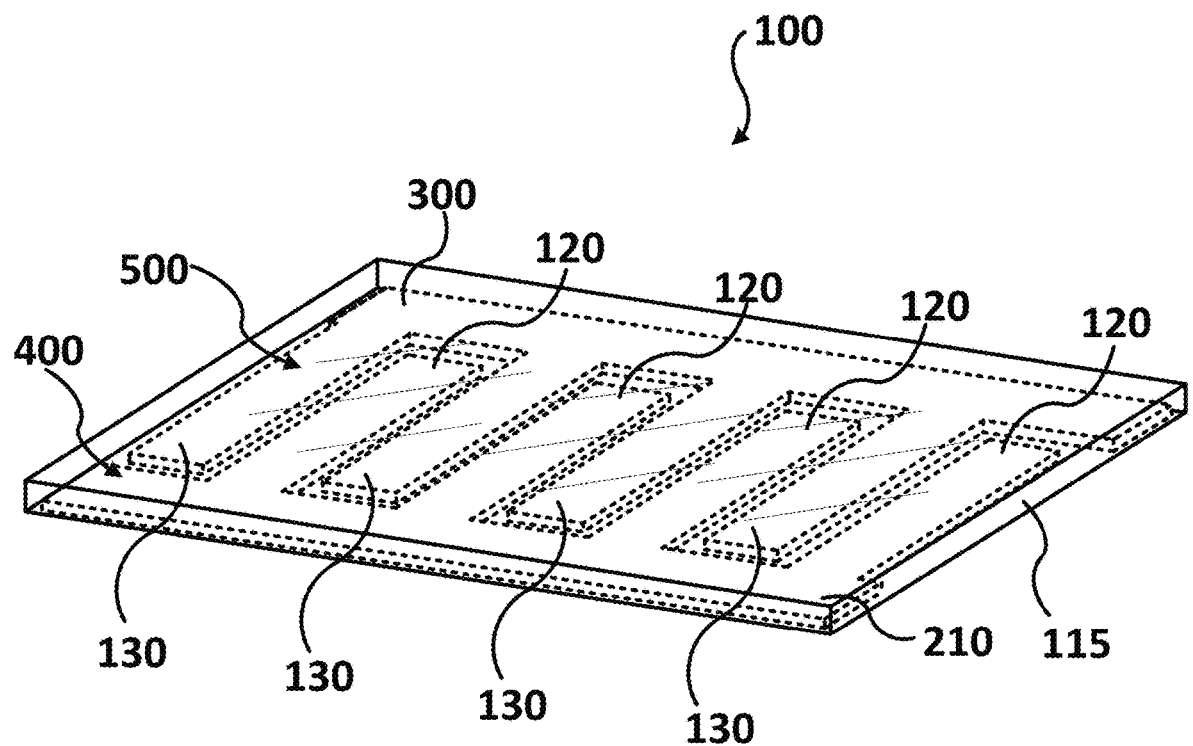
FIG. 7 illustrates a perspective view of an IBC perovskite PV device, after the optional removal of the substrate form the device, according to some embodiments of the present disclosure (e.g. by a first method).
Figure 7:
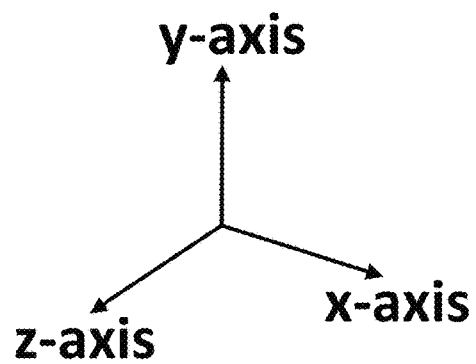

Alternatively, the substrate 200 may be removed from the PV device 100 after the PV device 100 is complete. Removal of the substrate 200 may result in a less costly final product by enabling recycle and reuse of the substrate 200. For the case where the substrate 200 is removed, the substrate 200 may be constructed from insulating materials and/or non-insulating materials, such as one or more suitable metallic materials (e.g. Ti, Al, Ni, Au, Pt) or metallic alloys as well as degenerately doped semiconductors (e.g. II-V or III-Vs). In some cases, a coating may be provided between the substrate 200 and the PV device 100 layers, to assist with easier separation of the substrate 200 from the PV device 100. FIG. 7 illustrates a final form of a PV device 100 that does not utilize the substrate 200, where the device is made by the "first method" (see FIG. 10).

Figure 8:
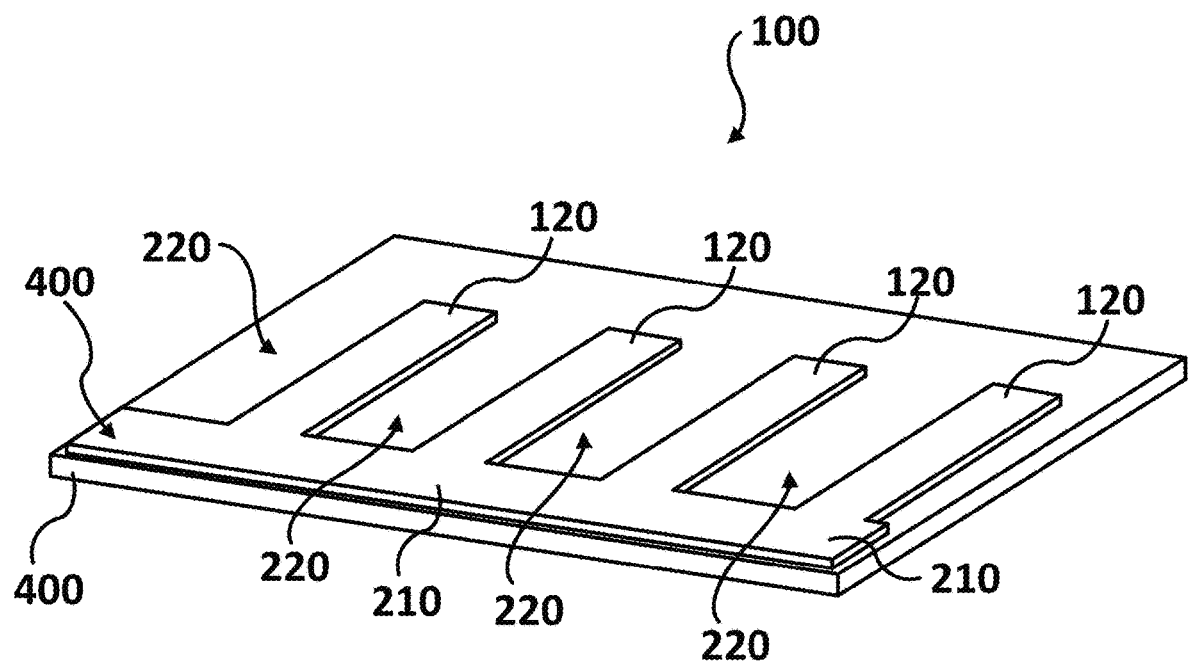
FIG. 8 illustrates a perspective view of the application of a p-type electrode to the top surface of a perovskite active layer, according to some embodiments of the present disclosure (e.g. by a second method).
Figure 8:
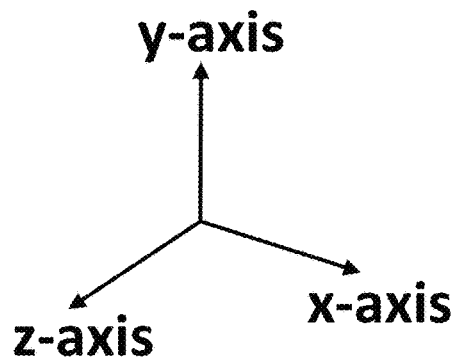

FIG. 8 illustrates an initial structure of a PV device 100 utilizing an alternative manufacturing method, referred to herein as the "second method". In this example, a perovskite active layer 115 is manufactured first. The perovskite active layer 115 may be deposited onto the device 100 by solution processing methods and/or CVD methods. As shown in FIG. 8, a first terminal 400 is deposited and patterned onto the perovskite active layer 115. The first terminal 440 includes a first busbar 210 positioned substantially within the x-z plane and aligned parallel to the x-axis. Four p-type electrodes 120 are illustrated, extending in the z-axis direction from the first busbar 210. However, more or fewer electrodes could be deposited onto the perovskite active layer 115, depending on the application. The first terminal 400 shown in FIG. 8, including the p-type electrodes 120 and the first busbar 210 may be deposited onto the perovskite active layer 115 by various methods: e.g. plating, chemical solution deposition, spin coating, chemical vapor deposition, atomic layer deposition, thermal evaporation, sputtering, and/or laser deposition. After the material(s) for the first terminal 400 have been deposited onto the perovskite active layer 115, various methods may be used to pattern the materials to obtain the final shape of the first terminal 400: e.g. silk screen printing, photo engraving, laser resist ablation, via conventional additive and subtractive photolithographic processing and/or using direct write-techniques (e.g. ink-jet, blade, spray) or any combination of these approaches. In this example, the p-type electrodes 120 are deposited and patterned on the perovskite active layer 115 in a first, independent step. However, it should be understood that n-type electrodes could alternatively be deposited and patterned on the perovskite active layer 115 in a first, independent step. In still other examples, one or more electrode materials (e.g. both n-type and p-type) may be deposited simultaneously onto the perovskite active layer 115. More details on various manufacturing methods are provided later in this disclosure (see FIGS. 10 and 11).

Figure 9:
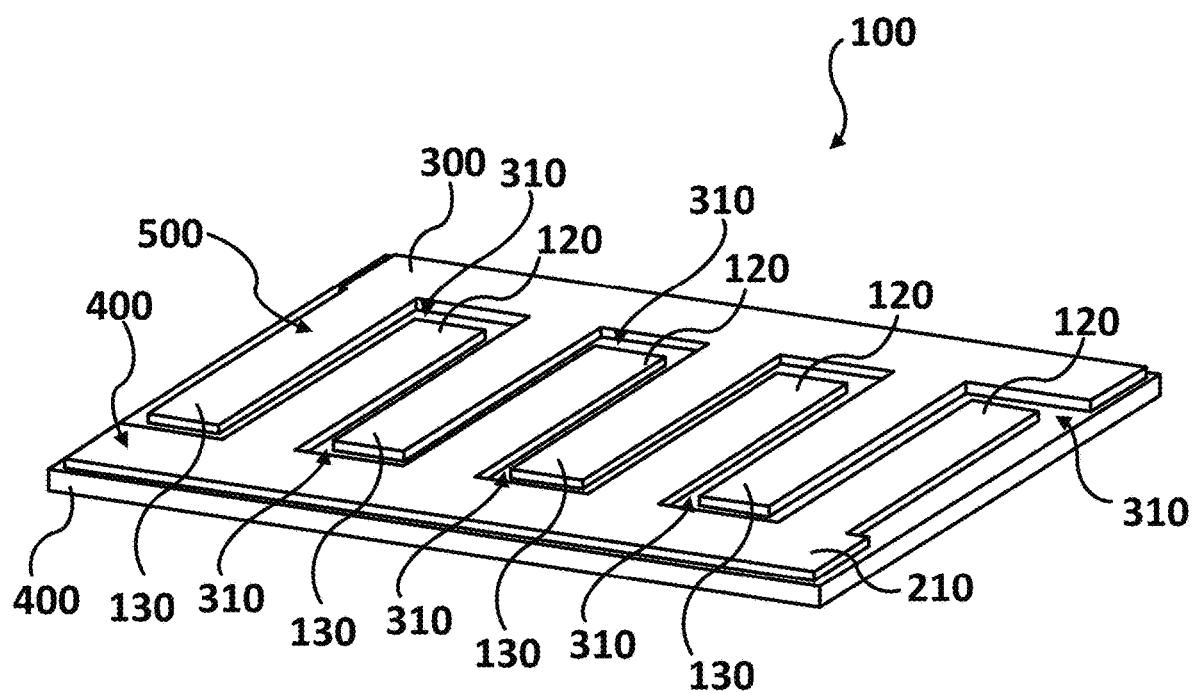
FIG. 9 illustrates a perspective view of the application of an n-type electrode to the top surface of a perovskite active layer to create interdigitated back contacts, according to some embodiments of the present disclosure (e.g. by a second method).
Figure 9:
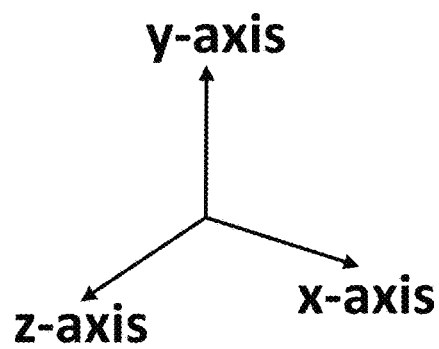

FIG. 9 illustrates a PV device 100 resulting from a next step of the "second method" method, the deposition of a second terminal 500 onto the perovskite active layer 115. In this example, the second terminal 500 includes four n-type electrodes 130, which are positioned within the gaps 220 that were previously formed by the p-type electrodes 120. The positioning of the n-type electrodes 130 into the gaps 220 between the p-type electrodes, results in the alternating electrode configuration (in the x-axis direction) illustrated in FIGS. 2 and 3. One end of each n-type electrode 130 extends in the z-axis direction towards the first busbar 210, but a space 310 remains so that the p-type electrodes 120 do not physically touch the first busbar. The remaining end of each n-type electrode 130 terminates at a second busbar 300, which is positioned substantially perpendicular to the n-type electrodes 130 and parallel to the first busbar 210. Thus, the second terminal 500 may be in the form of a long rectangular tab (the second busbar) aligned along the x-axis, with one or more shorter rectangular tabs (n-type electrodes 130) extending perpendicular from the long rectangular tab, such that all of the tabs are substantially positioned within the same plane (the x-z plane).

Thus, in the example shown in FIG. 9, both the p-type electrodes 120 and the n-type electrodes 130 are positioned substantially parallel to one another, within the same plane (in the x-z plane), and aligned along the z-axis direction. A space 310 remains between neighboring electrodes to prevent shorting. This space runs continuously across the PV device 100, alternating between straight runs in the x-axis direction and straight runs in the z-axis direction, resulting in an unbroken, continuous space separating the first terminal 400 from the second terminal 500. Grid spacing can vary between overlapping to over 1 mm separation.

The first terminal 500 shown in FIG. 9, including the p-type electrodes 120 and the first busbar 300 may be deposited onto the perovskite active layer 115 by various methods: e.g. plating, chemical solution deposition, spin coating, chemical vapor deposition, atomic layer deposition, thermal evaporation, sputtering, and/or laser deposition. After the material(s) for the first terminal 500 have been deposited onto the perovskite active layer 115, various methods may be used to pattern the materials to obtain the final shape of the first terminal 500: e.g. silk screen printing, photo engraving, laser resist ablation, via conventional additive and subtractive photolithographic processing or using direct write-techniques (ink-jet, blade, spray etc) or any combination of these approaches. Alternatively, a PV device 100 similar to that shown in FIG. 9 may also be obtained by simultaneously depositing and patterning both busbars and/or electrodes onto the perovskite active layer 115.

Deposition of a series of alternating p-type electrodes 120 and n-type electrodes 130 on the perovskite active layer 115 results in the formation of corresponding p-type active regions 140 and n-type active regions 150, separated by p-n junctions 160, as illustrated in FIGS. 2 and 3. Thus, the PV device 100 illustrated in FIG. 9 may be a fully functional PV device 100 capable of converting light (not shown) into electricity. However, additional layers may be needed to protect at least the perovskite active layer 115 from exposure to oxygen, air, moisture, and the environment and/or to add other functionality. This proposed device configuration is enabling for improving the light management (e.g. anti-reflection coating) or improved stability (e.g. barrier layer to prevent degradation of active layer) or to adjust the appearance of the device for more appealing esthetics. This could be done using the contacts as multifunctional device components in this alternative device configuration.

Figure 10:
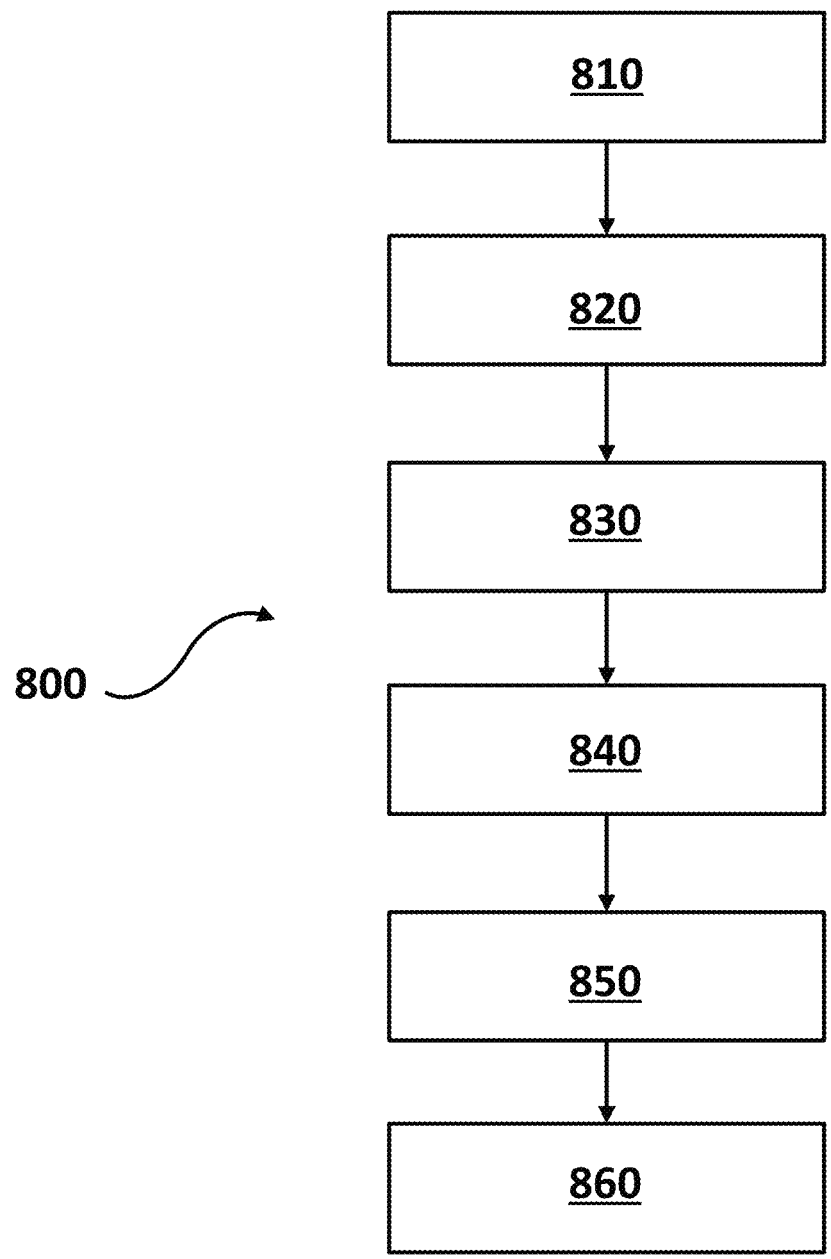
FIG. 10 summarizes a "first method" manufacturing method for producing an IBC perovskite PV device, according to some embodiments of the present disclosure.

FIG. 10 summarizes an example of the "first method" manufacturing method 800 for producing structures similar to those summarized above in FIGS. 4 through 7. In this first method, a manufacturing process may utilize a substrate, for example to simplify the manufacturing method, or as an element of the PV device itself. Therefore, a first method manufacturing method 800 may include substrate pre-treatment 810, for example to clean and/or pacify the substrate in preparation for deposition of the other layers used to construct the PV device. Substrate pretreatment 810 may include cleaning using a solvent, sterilization using heat, dust removal, UV exposure, etc. However, pre-treatment 810 is optional and the type of pre-treatment, length of time, and intensity will be determined according to the specific needs of a specific application. Any treatment that improves device performance and/or appearance may be introduced into the process (e.g. as selective sputtering to alter interfacial electronics or add texture for light management or appearance).

Once a substrate is deemed adequately prepared, the first method 800 may proceed with the application of a first electrode to the substrate 820. An example of a resultant structure is illustrated in FIG. 4. For example, material for a first electrode may first be deposited onto the substrate by conventional additive and subtractive photolithographic processing or using direct write-techniques (e.g. ink-jet, blade, spray) or any combination of these approaches followed by any additional conventional additive and subtractive photolithographic processing or using direct write-techniques (e.g. ink-jet, blade, spray) or any combination of these approaches.

After successful application of the first electrode to the substrate, the first method 800 may proceed with the application of a second electrode to the substrate 820. An example of a possible resultant structure is illustrated in FIG. 5. Alternatively, both the first electrode and the second electrode may be simultaneously positioned onto the substrate. For example, material for the first electrode and the second electrode may first be deposited onto the substrate by conventional additive and subtractive photolithographic processing or using direct write-techniques (e.g. ink-jet, blade, spray) or any combination of these approaches followed by patterning the first electrode and second electrode using followed by any additional conventional additive and subtractive photolithographic processing or using direct write-techniques (e.g. ink-jet, blade, spray) or any combination of these approaches followed by, for example, an oxidizing, etching or other interface altering step.

Next, a first method 800 may proceed with the application of a perovskite active layer 840 onto the electrodes and any remaining exposed substrate. For example, a liquid solution of an appropriate perovskite precursor (e.g. $PbI_2$ and $CH_3NH_3I$) may be applied to the top surface of the PV device, by dip or spin coating at some non-zero RPM for a sufficient duration of time to obtain a film, followed by subsequent perovskite active layer treatment 850, for example heat treatment at about 100° C. for about 15 minutes. Finally, as described above, depending on the application, the substrate may or may not be subsequently removed 860 from the PV device. In addition, a first method may conclude with the deposition of one or more barrier layers; e.g. oxygen, air, moisture, environmental barriers known to those experienced in the art.

Figure 11:
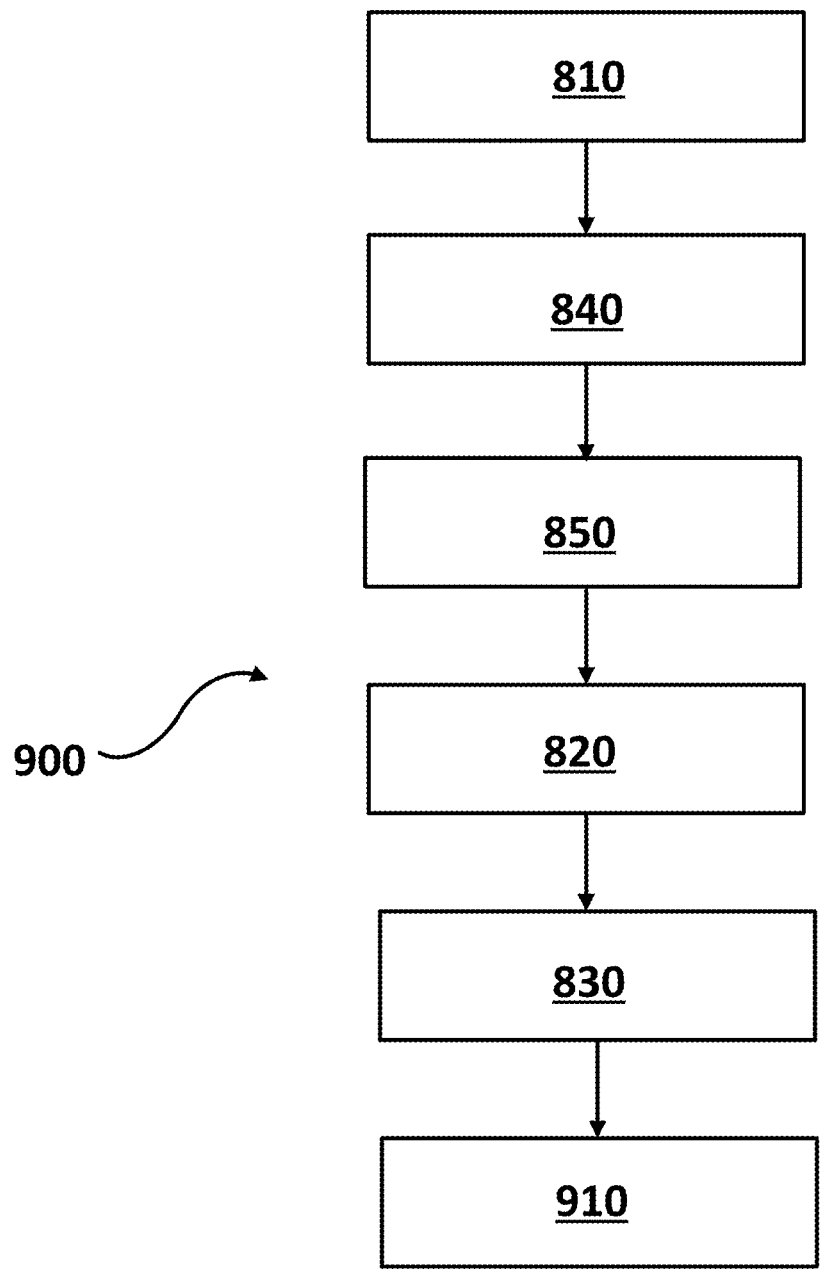
FIG. 11 summarizes a "second method" manufacturing method for producing an IBC perovskite PV device, according to some embodiments of the present disclosure.

FIG. 11 summarizes a second example for manufacturing perovskite PV devices, referred to herein as the "second method" 900 for producing structures similar to those summarized in FIGS. 8 through 9. This second method 900 may also utilize a substrate, for example to simplify the manufacturing method, or as an element of the PV device itself. Therefore, the second method 900 may include substrate pre-treatment 810 as described above for the first manufacturing method 800.

Once a substrate is deemed adequately prepared, the second method may proceed with the application of a perovskite active layer to a substrate 840. For example, a liquid solution of an appropriate perovskite precursor (e.g. $PbI_2$ and $CH_3NH_3I$) may be applied to the top surface of the PV device, by dip or spin coating at some non-zero RPM for a sufficient duration of time to obtain a film, followed by subsequent perovskite active layer treatment 850, for example heat treatment at about 100° C. for about 15 minutes. After successful application 840 and treatment 850 of the perovskite active layer 115 to a substrate, the second method 900 may proceed with the application of a first electrode to the perovskite active layer 820. An example of a resultant structure is illustrated in FIG. 8.

After successful application of the first electrode to the perovskite active layer, the second method 900 may proceed with the application of a second electrode to the perovskite active layer 830. An example of a resultant structure is illustrated in FIG. 9. Alternatively, both the first electrode and the second electrode may be simultaneously positioned onto the perovskite active layer.

Next, since the perovskite active layer is the light-receiving layer, the substrate layer in contact with the perovskite active layer may or may not need to be removed (step not shown). If a transparent substrate was initially chosen, the substrate may remain part of the finished PV device. Alternatively, if the material used to construct the substrate is opaque, the substrate may be removed.

Finally, a second method 900 may have one or more steps for applying one or more barrier layers 910; e.g. oxygen, air, moisture, environmental barriers.

Additional Concepts

1) At least some of the device configuration described herein may apply for any electronic/optoelectronic device in which a junction is a key operational aspect of the device. This could include LEDs, detectors, thin-film transistors or other electronic devices using the concept that all contacts could be on one side of the semiconductor using the fact that the contacts induce vertical changes in the film to have lateral material interfaces 2) Multi junction solar cells: At least some of the device configurations and methods described herein could enable the creation of ultra-low cost efficient devices by permitting direct integration on top of other PV technologies. That is some of the concepts described herein may allow a tandem structure to be deposited onto any existing solar cell. For example, a perovskite top cell may be added to another photovoltaic device to increase the efficiency of existing modules.

3) Some embodiments of the devices and methods described herein may also work based on the charge selectivity of the contacts. In these embodiments, a region above a contact may be intrinsic in comparison to the contacts. (If there is some other way to induce the junction, and the electrodes described above could be applied both to one side of the perovskite layer, the same formalism holds. A photovoltaic device may also operate with completely intrinsic layer, if the carriers can reach their respective contact.)

4) In other cases, a perovskite in which the lateral junctions are paired with another absorber may also be used (e.g. hybrid-perovskite/organic or hybrid-perovskite/III-V or hybrid-perovskite/other suitable photovoltaic absorber).

5) In other devices as described herein, the intrinsic, p-type regions and/or the n-type regions are not of equal size and/or dimensions. In some cases, the dimensions of the various active layer regions may vary depending on the corresponding carrier lifetimes for their respective regions.

Figure 12:
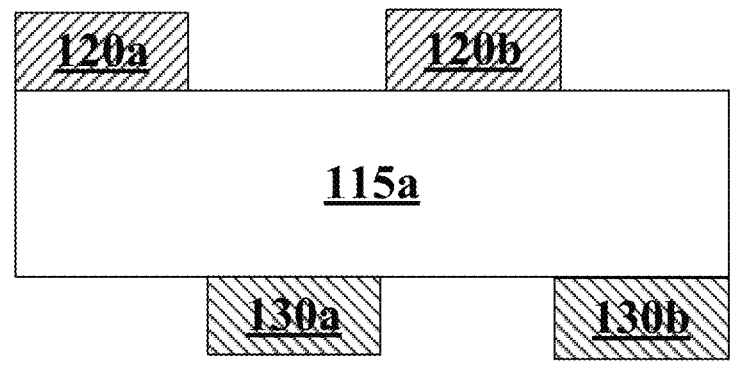
FIG. 12 illustrates alternative n-type and p-type electrode configurations, and their relationship to a perovskite active layer, according to some embodiments of the present disclosure.
Figure 12:
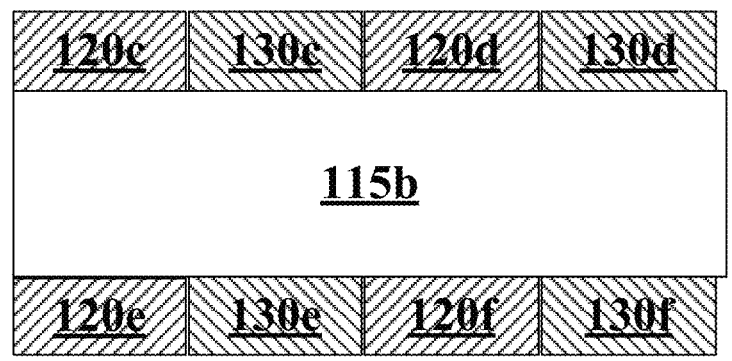

6) In some examples, the p-type and/or n-type electrodes may be configured into a photovoltaic device as gridded contacts on both sides to increase carrier collection and reduce shadowing relative to conventional configurations or to enable reduced shadowing in multi-junction cells. This may create a junction with the grids lined up to provide a transparent photovoltaic device (e.g. top of a tandem device). (FIG. 12 provides an example.) FIG. 12 illustrates a first PV device 100*a* having a perovskite active layer 115*a* having a first surface and a second surface, which is parallel to the first surface. The perovskite active layer 115*a* is in contact with at least two p-type electrodes (120*a* and 120*b*) positioned in contact with the first surface and is in contact with at least two n-type electrodes (130*a* and 130*b*) positioned in contact with the second surface. The PV device 100*a* offers the benefits of reducing shading, which allows light to pass by the electrodes. FIG. 12 illustrates a second PV device 100*b* having a perovskite active layer 115*b* and also having a first surface and a second surface parallel to the first surface. However, the PV device 100*b* includes both p-type electrodes (120*c* and 120*d*) and n-type electrodes (130c and 130d) positioned in contact with the first surface of the perovskite active layer 115b. In addition, the PV device 100b includes both p-type electrodes (120e and 120f) and n-type electrodes (130e and 130f) positioned in contact with the first surface of the perovskite active layer 115b.

Figure 13:
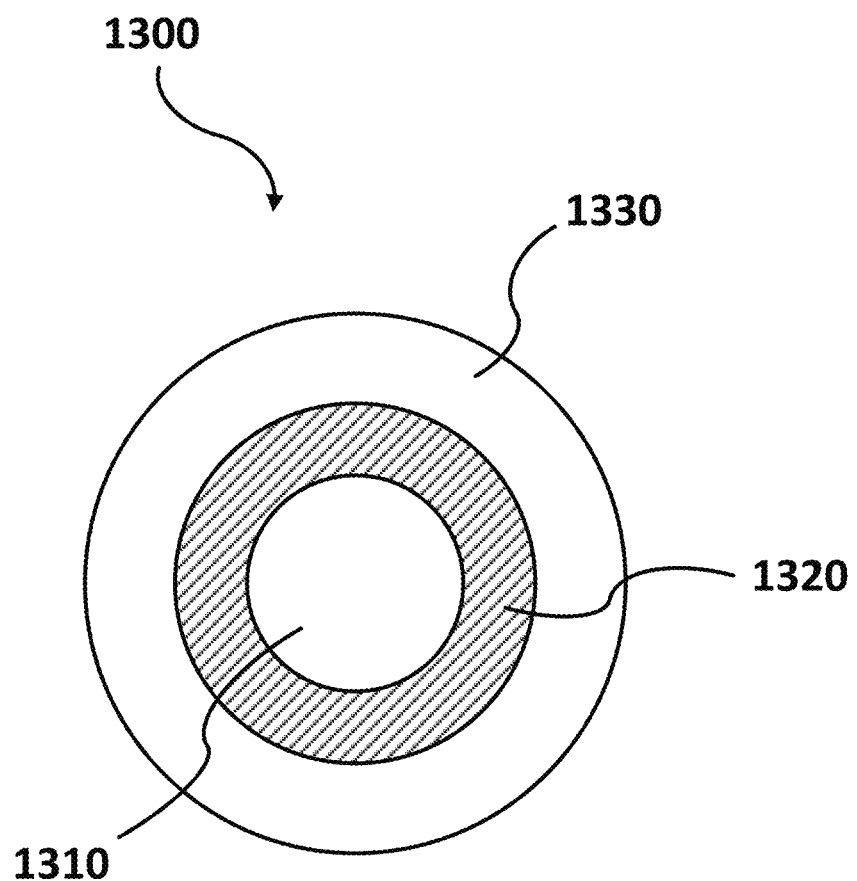
FIG. 13 illustrates PV wire that may be used to create PV fabrics, according to some embodiments of the present disclosure.

FIG. 13 illustrates another embodiment of the present disclosure, a PV device in the form of a PV wire 1300. In this example, the PV wire 1300 includes a metal core 1310 covered by an inner metal oxide layer 1320, which in turn is covered by an outer perovskite active layer 1330. Thus, a PV wire 1300 may be used as both an electrode and a substrate to be used as a thread, such that when multiple threads are interwoven, a fabric may be produced having PV functionality. In some embodiments of the present disclosure, such a PV wire 1300 may have a junction that is only formed in the fabric. The metal core 1310 may act as the electrode, as well as the substrate for charge transport layers; e.g. hole transport layers HTL, and electron transport layers ETL. In some embodiments of the present disclosure, a fabric may include p-type PV wires having p-type perovskite active layers interwoven with n-type PV wires having n-type perovskite active layers, such that the weave may produce junctions due to the physical contact as describe above for the interdigitated embodiments.

Figure 14:
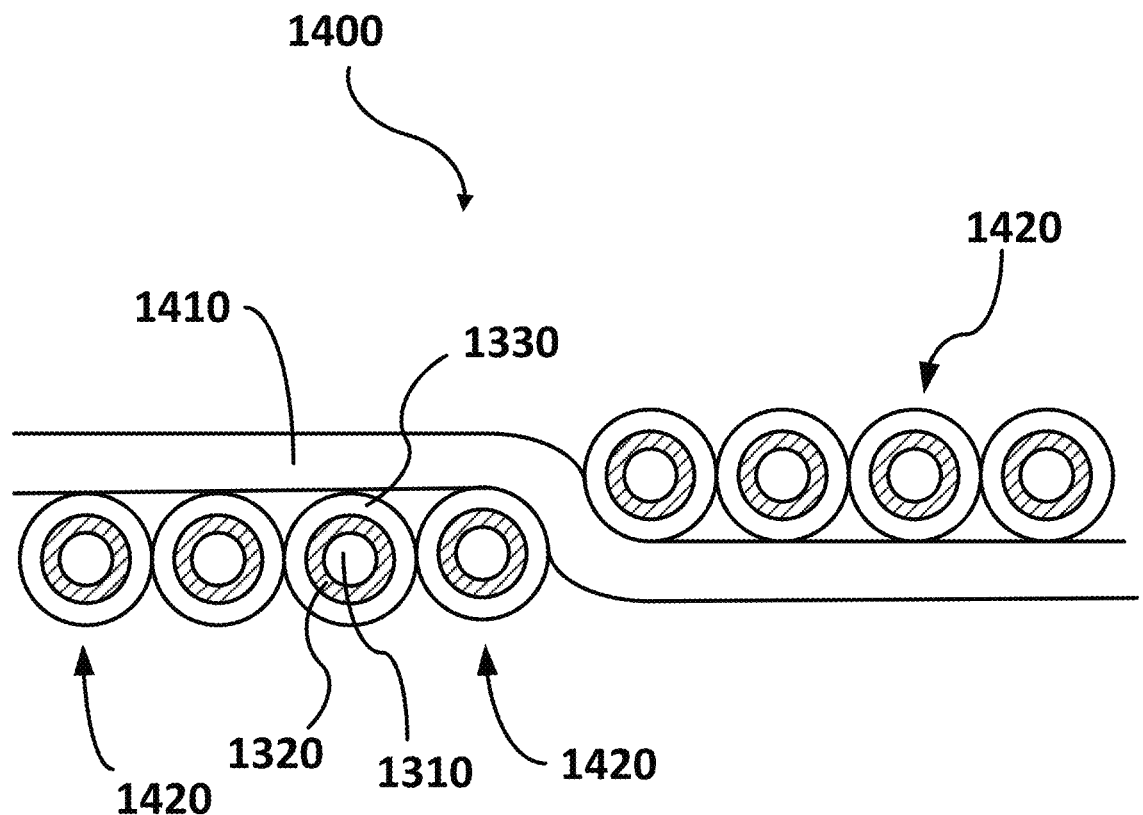
FIG. 14 illustrates a PV fabric, according to some embodiments of the present disclosure.

Referring again to FIG. 13, in some embodiments of the present disclosure, the metal core 1310 may be constructed of a metal wire, such as nickel and/or titanium. For example, a PV wire 1300 may include a nickel metal core 1310 having an inside nickel oxide HTL as the metal oxide layer 1320 and an outer p-type perovskite active layer 1330, resulting in a p-type PV wire 1300. Similarly, a PV wire 1300 may include a titanium metal core 1310 having an inside titanium oxide ETL as the metal oxide layer 1320 and an outer n-type perovskite active layer 1330, resulting in a n-type PV wire 1300. Subsequent contacting of an n-type PV wire with a p-type PV wire may result in a junction and a PV device in the form of a PV fabric 1400, as shown in FIG. 14. FIG. 14 illustrates a plurality of n-type PV wires 1420 in contact with a plurality of p-type PV wires 1410 to produce the PV fabric 1400, wherein each PV wire (1410 and 1420) includes a metal core 1310 covered by a metal oxide layer 1320, which is covered by a perovskite active layer 1330 (these elements are only shown for the n-type PV wires 1420). In some embodiments of the present disclosure, the voids shown between the plurality of PV wires (1410 and 1420) could be filled with additional perovskite active material. In some embodiments of the present disclosure, the PV fabric 1400 could be treated to provide a coating and/or film between the individual PV wires (1410 and 1420). Also, although shown is cylindrical wires, PV wires could be formed in any suitable shape or form. Although FIG. 13 shows a weave that includes four n-type PV wires 1420 in a row interwoven with a single p-type PV wire 1410, it should be understood that other combinations are possible (e.g. a single p-type PV wire interwoven per individual n-type PV wire, 2 to 2, 3 to 3, etc.) and are considered to fall within the scope of the present disclosure.

EXAMPLES

Example 1

A method comprising applying a perovskite precursor solution to a first solid conductor; and treating the perovskite precursor solution such that a first portion of the perovskite precursor solution is converted to a first solid perovskite, wherein: the first solid conductor comprises a first charge transport characteristic, which is predominantly p-type or predominantly n-type, and the treating results in the first solid perovskite having a second charge transport characteristic that is substantially the same as the first charge transport characteristic.

Example 2

The method of example 1, wherein: prior to the treating, the applying further comprises applying the perovskite precursor solution to a second solid conductor comprising a third charge transport characteristic, which is predominantly p-type or predominantly n-type, the second solid conductor is separated by a space from the first solid conductor, the third charge transport characteristic is opposite to the charge transport characteristic of the first charge transport characteristic, the applying at least partially fills the space with the perovskite precursor solution, during the treating, a second portion of the perovskite precursor solution applied to the second solid conductor is converted to a second solid perovskite comprising a fourth charge transport characteristic that is substantially the same as the third charge transport characteristic, and during the treating, a third portion of the perovskite precursor solution at least partially filling the space is converted to a solid perovskite p-n junction.

Example 3

The method of either Example 1 or 2, further comprising: forming an additional solid on the first solid perovskite, wherein: the additional solid comprises at least one of a thermally insulating solid, an electrically insulating solid, a liquid barrier solid, or a gas barrier solid.

Example 4

The method of Example 2, further comprising: forming an additional solid on the first solid perovskite and the second solid perovskite, wherein: the additional solid comprises at least one of a thermally insulating solid, an electrically insulating solid, a liquid barrier solid, or a gas barrier solid.

Example 5

The method of any one of Examples 1-4, wherein the treating comprises thermally treating the perovskite precursor solution.

Example 6

The method of any one of Examples 1-5, wherein the thermally treating comprises heating the perovskite precursor solution to a temperature between about 30° C. and about 120° C.

Example 7

The method of any one of Examples 1-6, wherein the first solid perovskite comprises a first alkyl ammonium metal halide.

Example 8

The method of any one of Examples 2 and 4-7, wherein the first solid perovskite comprises a first alkyl ammonium metal halide and the second solid perovskite comprises a second alkyl ammonium metal halide.

Example 9

The method of Example 7, wherein the first alkyl ammonium metal halide comprises at least one of $CH_3NH_3PbI_{3-x}Cl_x$ or $CH_3NH_3PbI_{3-x}Br_x$ where x is between 0 and 3.

Example 10

The method of Example 8, wherein the second alkyl ammonium metal halide comprises at least one of $CH_3NH_3PbI_{3-x}Cl_x$ or $CH_3NH_3PbI_{3-x}Br_x$ where x is between 0 and 3.

Example 11

The method of any one of Examples 1-10, wherein the first charge transport characteristic is substantially p-type.

Example 12

The method of any one of Examples 1-11, wherein the first solid conductor comprises at least one of platinum, palladium, lead, copper, zinc, nickel, aluminum, indium, cobalt, tin, or gallium.

Example 13

The method of any one of Examples 1-12, wherein the first solid conductor comprises an oxide.

Example 14

The method of any one of Examples 1-13, wherein the first solid conductor comprises at least one of copper oxide ($Cu_2O$), nickel oxide (NiO), indium copper oxide ($InCuO_x$), or indium gallium oxide ($InGaO_x$).

Example 15

The method of any one of Examples 1-14, wherein the first solid conductor comprises at least one of spiro-OMeTAD, p-doped carbon nanotubes, p-doped graphene, or PEDOT:PSS.

Example 16

The method of any one of Examples 2 and 4-15, wherein the third charge transport characteristic is substantially n-type.

Example 17

The method of any one of Examples 2 and 4-16, wherein the second solid conductor comprises at least one of fluorine-doped tin oxide (FTO), gallium oxide ($Ga_2O_3$), indium zinc oxide (InZnO), aluminum oxide ($Al_2O_3$), zinc oxide (ZnO), titanium dioxide ($TiO_2$), zirconium dioxide ($ZrO_2$), tin oxide ($SnO_x$), indium tin oxide (InSnO), indium oxide ($InO_x$), n-doped carbon nanotubes, or n-doped graphene.

Example 18

The method of any one of Examples 2 and 4-17, wherein the second solid conductor comprises at least one of copper or nickel having an oxide layer covering at least a portion of the copper or nickel.

Example 19

The method of any one of Examples 2 and 4-18, wherein the second solid conductor comprises at least one of aluminum, zinc, titanium, or zirconium having an oxide layer covering at least a portion of the aluminum, zinc, titanium, or zirconium.

Example 20

The method of any one of Examples 1-12, wherein the first charge transport characteristic is substantially n-type.

Example 21

The method of any one of Examples 1-12 and 20, wherein the first solid conductor comprises at least one of fluorine-doped tin oxide (FTO), gallium oxide ($Ga_2O_3$), indium zinc oxide (InZnO), aluminum oxide ($Al_2O_3$), zinc oxide (ZnO), titanium dioxide ($TiO_2$), zirconium dioxide ($ZrO_2$), tin oxide ($SnO_x$), indium tin oxide (InSnO), indium oxide ($InO_x$), n-doped carbon nanotubes, or n-doped graphene.

Example 22

The method of any one of Examples 1-12, 20, and 21, wherein the first solid conductor comprises at least one of copper or nickel having an oxide layer covering at least a portion of the copper or nickel.

Example 23

The method of any one of Examples 1-12 and 20-22, wherein the first solid conductor comprises at least one of aluminum, zinc, titanium, or zirconium having an oxide layer covering at least a portion of the aluminum, zinc, titanium, or zirconium.

Example 24

The method of any one of Examples 2 and 4-12, wherein the third charge transport characteristic is substantially p-type.

Example 25

The method of any one of Examples 2, 4-12, and 24, wherein the second solid conductor comprises at least one of platinum, palladium, lead, copper, zinc, nickel, aluminum, indium, cobalt, tin, or gallium.

Example 26

The method of any one of Examples 2, 4-12, 24, and 25, wherein the second solid conductor comprises an oxide.

Example 27

The method of any one of Examples 2, 4-12, and 24-26, wherein the second solid conductor comprises at least one of copper oxide ($Cu_2O$), nickel oxide (NiO), indium copper oxide ($InCuO_x$), or indium gallium oxide ($InGaO_x$).

Example 28

The method of any one of Examples 2, 4-12, and 24-27 wherein the second solid conductor comprises at least one of spiro-OMeTAD, p-doped carbon nanotubes, p-doped graphene, or PEDOT:PSS.

Example 29

The method of any one of Examples 1-28, wherein the first portion has a first bandgap between about 0 eV and about 6 eV.

Example 30

The method of any one of Examples 2-29, wherein the second portion has a second bandgap between about 0 eV and about 6 eV.

Example 31

The method of any one of Examples 1-30, wherein at least one of the first solid conductor or the second solid conductor is in a substantially cylindrical shape.

Example 32

The method of any one of Examples 1-31, wherein at least one of the first solid conductor or the second solid conductor is substantially in a planar shape.

Example 33

A method comprising: depositing a first solid conductor onto a first portion of a first solid perovskite, wherein: the first solid conductor comprises a first charge transport characteristic, which is predominantly p-type or predominantly n-type, and the depositing results in at least a fraction of the first portion of the first solid perovskite converting to a second solid perovskite having a second charge transport characteristic that is substantially the same as the first charge transport characteristic.

Example 34

The method of Example 33, further comprising: depositing a second solid conductor onto a second portion of the first solid perovskite, wherein: the second portion is separated from the first portion by a third portion of the first solid perovskite, the third portion is not in contact with either the first solid conductor or the second solid conductor, the second solid conductor comprises a third charge transport characteristic, which is predominantly p-type or predominantly n-type, the third charge transport characteristic is substantially opposite of the charge transport characteristic of the first charge transport characteristic, the depositing of the second solid conductor results in at least a fraction of the second portion of the first solid perovskite converting to a third solid perovskite having a fourth charge transport characteristic that is substantially the same as the third charge transport characteristic, and the third portion is converted to a solid perovskite p-n junction.

Example 35

The method of Example 34, further comprising, prior to the depositing of the first solid conductor and the depositing of the second solid conductor, forming the first solid perovskite on a substrate.

Example 36

The method of either Examples 34 or 35, wherein the forming comprises: applying a perovskite precursor solution to a surface of the substrate, and thermally treating the perovskite precursor solution to form the first solid perovskite.

Example 37

The method of any one of Examples 34-36 further comprising, after the depositing of the first solid conductor and the depositing of the second solid conductor: removing the substrate from at least one of the first solid perovskite and the second solid perovskite.

Example 38

The method of any one of Examples 35-37, wherein at least one of the depositing of the first solid conductor or the depositing of the second solid conductor is performed by at least one of thermal evaporation, sputtering, pulsed laser deposition, electron beam deposition, or inkjet printing.

Example 39

A device comprising: a p-type solid conductor separated from an n-type solid conductor by a space, and a solid perovskite positioned in contact with the p-type solid conductor and the n-type solid conductor such that the solid perovskite comprises a first portion that is in contact with the p-type solid conductor, a second portion that is in contact with the n-type solid conductor, and a third portion that at least partially fills the space, wherein: the first portion comprises a substantially p-type solid perovskite, the second portion comprises a substantially n-type solid perovskite, and the third portion comprises a solid perovskite p-n junction.

Example 40

The device of Example 39, wherein the solid perovskite comprises an alkyl ammonium metal halide.

Example 41

The device of Example 40, wherein the alkyl ammonium metal halide comprises at least one of $CH_3NH_3PbI_{3-x}Cl_x$ or $CH_3NH_3PbI_{3-x}Br_x$ where x is between 0 and 3.

Example 42

The device of any one of Examples 39-41, wherein the p-type solid conductor comprises a metal.

Example 43

The device of Example 42, wherein the metal of the p-type solid conductor comprises at least one of platinum, palladium, lead, copper, zinc, nickel, aluminum, indium, cobalt, tin, or gallium.

Example 44

The device of any one of Examples 39-43, wherein the p-type solid conductor comprises an oxide.

Example 45

The device of any one of Examples 39-44, wherein the p-type solid conductor comprises at least one of copper oxide ($Cu_2O$), nickel oxide (NiO), indium copper oxide ($InCuO_x$), or indium gallium oxide ($InGaO_x$).

Example 46

The device of any one of Examples 39-45, wherein the p-type solid conductor comprises at least one of spiro-OMeTAD, p-doped carbon nanotubes, p-doped graphene, or PEDOT:PSS.

Example 47

The device of any one of Examples 39-46, wherein the n-type solid conductor comprises at least one of fluorine-doped tin oxide (FTO), gallium oxide ($Ga_2O_3$), indium zinc oxide (InZnO), aluminum oxide ($Al_2O_3$), zinc oxide (ZnO), titanium dioxide ($TiO_2$), zirconium dioxide ($ZrO_2$), tin oxide ($SnO_x$), indium tin oxide (InSnO), indium oxide ($InO_x$), n-doped carbon nanotubes, or n-doped graphene.

Example 48

The device of any one of Examples 39-47, wherein the n-type solid conductor comprises at least one of copper or nickel having an oxide layer covering at least a portion of the copper or nickel.

Example 49

The device of any one of Examples 39-48, wherein the n-type solid conductor comprises at least one of aluminum, zinc, titanium, or zirconium having an oxide layer covering at least a portion of the aluminum, zinc, titanium, or zirconium.

Example 50

The device of any one of Examples 39-49, wherein the first portion has a first bandgap between about 0 eV and about 6 eV.

Example 51

The device of any one of Examples 39-50, wherein the second portion has a second bandgap between about 0 eV and about 6 eV.

Example 52

The device of any one of Examples 39-51, wherein at least one of the p-type solid conductor or the n-type solid conductor is substantially in a cylindrical shape.

Example 53

The device of any one of Examples 39-52, wherein at least one of the p-type solid conductor or the n-type solid conductor is substantially in a planar shape.

What is claimed is:

1. A method comprising:
    applying a first solid conductor comprising nickel to a substrate;
    applying a second solid conductor comprising titanium to the substrate such that a space is created between the first solid conductor and the second solid conductor;
    oxidizing at least a portion of the nickel to form a p-type nickel oxide layer on the first solid conductor;
    oxidizing at least a portion of the titanium to form an n-type titanium oxide layer on the second solid conductor;
    depositing a film of a perovskite precursor solution on the nickel oxide and the titanium oxide and filling the space with the solution; and
    treating the perovskite precursor solution such that the perovskite precursor solution is converted to a solid perovskite, wherein:
    a first portion of the solid perovskite in contact with the p-type nickel oxide layer is converted to a p-type solid perovskite,
    a second portion of the solid perovskite in contact with the n-type titanium oxide layer is converted to an n-type solid perovskite, and
    a p-n junction is formed between the first portion and the second portion in the space.

2. The method of claim 1, further comprising:
    forming an additional solid on the solid perovskite, wherein:
    the additional solid comprises at least one of a thermally insulating solid, an electrically insulating solid, a liquid barrier solid, or a gas barrier solid.

3. The method of claim 1, wherein the treating comprises thermally treating the perovskite precursor solution.

4. The method of claim 3, wherein the thermally treating comprises heating the perovskite precursor solution to a temperature between about 30° C. and about 120° C.

5. The method of claim 1, wherein the applying of the first solid conductor is performed by at least one of chemical solution deposition, spin coating, chemical vapor deposition, atomic layer deposition, thermal evaporation, sputtering, or laser deposition.

6. The method of claim 1, wherein the applying of the second solid conductor is performed by at least one of chemical solution deposition, spin coating, chemical vapor deposition, atomic layer deposition, thermal evaporation, sputtering, or laser deposition.

7. The method of claim 1, wherein the applying of the first solid conductor and the applying of the second solid conductor result in the first solid conductor and the second solid conductor being interdigitated.

8. The method of claim 1, wherein a third portion of the solid perovskite comprises a perovskite having intrinsic characteristics.

9. The method of claim 1, wherein the depositing is performed by at least one of a solution processing method or by a CVD method.

* * * * *